(12) United States Patent
Ma et al.

(10) Patent No.: US 12,279,478 B2
(45) Date of Patent: Apr. 15, 2025

(54) DISPLAY DEVICE

(71) Applicant: Samsung Display Co., LTD., Yongin-si (KR)

(72) Inventors: Jin Seock Ma, Hwaseong-si (KR); Moo Soon Ko, Seoul (KR); Se Wan Son, Hwaseong-si (KR); Jin Goo Jung, Seongnam-si (KR); Kyung Hyun Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 513 days.

(21) Appl. No.: 17/572,779

(22) Filed: Jan. 11, 2022

(65) Prior Publication Data
US 2022/0302420 A1 Sep. 22, 2022

(30) Foreign Application Priority Data
Mar. 18, 2021 (KR) .......................... 10-2021-0035334

(51) Int. Cl.
| | | |
|---|---|---|
| H01L 51/52 | (2006.01) | |
| G06F 3/044 | (2006.01) | |
| H01L 27/32 | (2006.01) | |
| H10K 50/86 | (2023.01) | |
| H10K 59/40 | (2023.01) | |
| H10K 59/65 | (2023.01) | |

(52) U.S. Cl.
CPC ......... *H10K 50/865* (2023.02); *G06F 3/0446* (2019.05); *H10K 59/40* (2023.02); *H10K 59/65* (2023.02)

(58) Field of Classification Search
CPC ............... H10K 59/65; H10K 59/8792; H10K 59/8791; H10K 59/40; H10K 59/873; H10K 59/10–221; H10K 59/131; H10K 59/35; H10K 59/353; H10K 59/8731; H10K 50/865; H10K 59/00–95; H10K 50/00–88; G06F 3/0446; G06F 3/0412
See application file for complete search history.

(56) References Cited

U.S. PATENT DOCUMENTS

| | | | | |
|---|---|---|---|---|
| 2021/0249635 | A1* | 8/2021 | Cho | ........................ H10K 50/86 |
| 2021/0336232 | A1* | 10/2021 | Baek | ...................... G02B 1/115 |
| 2022/0140014 | A1* | 5/2022 | Shim | ..................... H10K 50/865 |
| | | | | 257/40 |

FOREIGN PATENT DOCUMENTS

| | | |
|---|---|---|
| KR | 1020160071567 | 6/2016 |
| KR | 1020180136614 | 12/2018 |

(Continued)

OTHER PUBLICATIONS

Translation of KR '432 (Year: 2019).*

*Primary Examiner* — Shahed Ahmed
*Assistant Examiner* — Rhys Poniente Sheker
(74) *Attorney, Agent, or Firm* — CANTOR COLBURN LLP

(57) ABSTRACT

A display device includes a substrate that includes a display area and a transmissive area, a first blocking layer that is disposed on the display area of the substrate, and disposed on a first surface of the substrate, a second blocking layer that is disposed in the display area of the substrate, and disposed on a second surface of the substrate opposite to the first surface, an insulation layer that is disposed on the first blocking layer, a transistor that is disposed on the insulation layer, and a light emitting element that is connected to the transistor.

20 Claims, 23 Drawing Sheets

(56) References Cited

FOREIGN PATENT DOCUMENTS

KR          102052432 B1 * 12/2019 ........... C09K 11/025
KR          102183530      11/2020

* cited by examiner

DISPLAY DEVICE

This application claims priority to Korean Patent Application No. 10-2021-0035334 filed on Mar. 18, 2021, and all the benefits accruing therefrom under 35 U.S.C. § 119, the content of which in its entirety is herein incorporated by reference.

BACKGROUND

1. Field

Embodiments of the invention relate to a display device.

2. Description of the Related Art

A display device may include an optical device such as a sensor, a camera, or the like. The optical device may be disposed in a bezel area (i.e., an area surrounding a screen) of the display device to avoid interference with the screen.

When a size of the bezel of the display device is reduced, a screen-to-body ratio of the display device, that is, when viewing the display device from the front, a ratio occupied by the screen may be increased. The screen-to-body ratio reflects a technology level of the display device, and at the same time, serves an important role in a consumer's product selection.

SUMMARY

As a bezel of a display device is reduced, it becomes difficult to dispose an optical device in the bezel area, and accordingly, a technology for disposing the optical device in the screen is being developed. As described, when disposing the optical device in the screen, it is desired to prevent the visibility of the optical device from being lowered by light incident around the optical device.

Embodiments are to provide a display device where an optical device is disposed in a screen, to prevent degradation of display quality due to light that may be introduced into the periphery of the optical device.

It is apparent that the features of the embodiments are not limited to the above purpose, and may be variously expanded without departing from the spirit and scope of the embodiments.

A display device in an embodiment includes a substrate that includes a display area and a transmissive area, a first blocking layer that is disposed on the display area of the substrate, and disposed on a first surface of the substrate, a second blocking layer that is disposed in the display area of the substrate, and disposed on a second surface of the substrate opposite to the first surface, an insulation layer that is disposed on the first blocking layer, a transistor that is disposed on the insulation layer, and a light emitting element that is connected to the transistor.

In an embodiment, the first blocking layer may include a first layer disposed on the substrate and a second layer disposed on the first layer, and the second blocking layer may include a third layer disposed below the substrate and a fourth layer disposed below the third layer.

In an embodiment, the first blocking layer may include a metal, and the second blocking layer may include a metal oxide.

In an embodiment, the first layer of the first blocking layer may include amorphous silicon, and the second layer of the first blocking layer may include a metal.

In an embodiment, the third layer of the second blocking layer may include a metal oxide, and the fourth layer of the second blocking layer may include a silicon oxide.

In an embodiment, the metal oxide of the third layer of the second blocking layer may be a molybdenum tantalum oxide, and an amount of tantalum in the metal oxide may be about 8 wt % or more.

In an embodiment, a refractive index of the third layer of the second blocking layer may be about 2.2 to about 2.6.

In an embodiment, the refractive index of the third layer of the second blocking layer may be about 2.46.

In an embodiment, an extinction coefficient of the third layer of the second blocking layer may be about 0.5 to about 0.9.

In an embodiment, an extinction coefficient of the third layer of the second blocking layer may be about 0.67.

In an embodiment, the metal may include at least one of molybdenum, aluminum, titanium, and copper.

In an embodiment, a thickness of the first layer of the first blocking layer in a direction perpendicular to a main extension of the substrate may be greater than about 20 angstroms (Å) and less than about 300 Å.

In an embodiment, a thickness of the fourth layer of the second blocking layer in a direction perpendicular to a main extension of the substrate may be included in a range of about 20 Å to about 300 Å.

A display device in an embodiment includes a substrate including a first display area including a first pixel area and a second display area that includes a second pixel area and a transmissive area neighboring each other, an optical device that overlaps the second display area, and a first blocking layer and a second blocking layer that are disposed in the second pixel area of the second blocking layer, the first blocking layer disposed on a first surface of the substrate, and the second blocking layer disposed on a second surface of the substrate opposite to the first surface.

In an embodiment, openings overlapping the transmissive area may be defined in the first blocking layer and the second blocking layer, and an opening of the openings may be defined in a shape of a planar cross.

In an embodiment, an edge of the opening may be defined in the shape of the planar cross having a planar shape in which a recess portion and a convex portion are repeated.

In an embodiment, openings overlapping the transmissive area may be defined in the first blocking layer and the second blocking layer, and an opening of the openings may have a circular or oval planar shape.

In the display device in the embodiment, the optical device is disposed in the screen, and display quality deterioration due to light that may be inflowed around the optical device may be prevented.

It is apparent that the effects of the embodiments are not limited to the above purpose, and may be variously expanded without departing from the spirit and scope of the embodiments.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
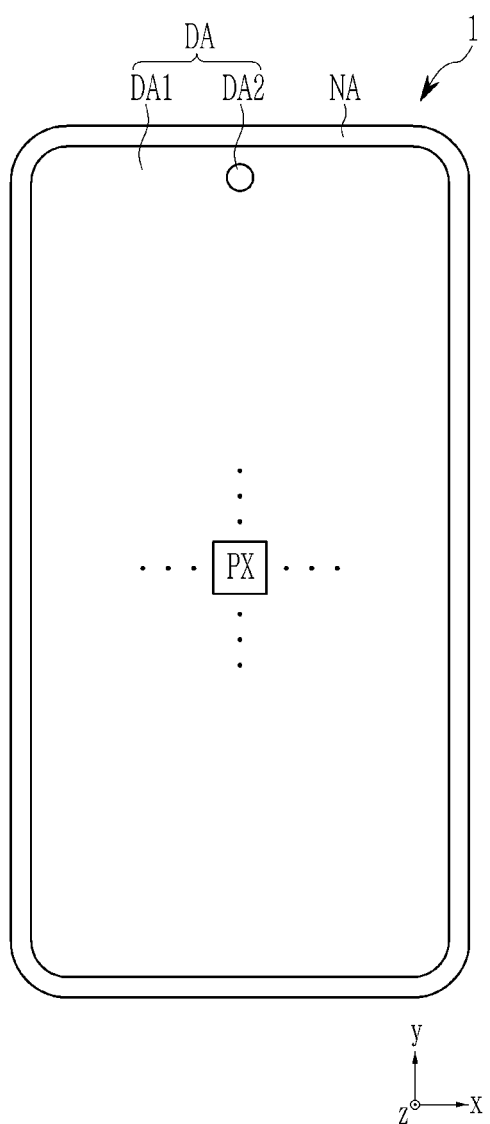
FIG. 1 is a schematic top plan view of an embodiment of a display device 1.

The embodiments will be described more fully hereinafter with reference to the accompanying drawings, in which embodiments are shown. As those skilled in the art would realize, the described embodiments may be modified in various different ways, all without departing from the spirit or scope of the embodiments.

The drawings and description are to be regarded as illustrative in nature and are not restrictive. Like reference numerals designate like elements throughout the specification.

In the drawings, size and thickness of each element are arbitrarily illustrated for convenience of description, and the embodiments are not necessarily limited to as illustrated in the drawings. In the drawings, the thicknesses of layers, films, panels, regions, etc., are exaggerated for clarity. In addition, in the drawings, for better understanding and ease of description, the thicknesses of some layers and regions are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "in a plan view" means viewing a target portion from the top, and the phrase "in a cross-section" means viewing a cross-section formed by vertically cutting a target portion from the side.

In addition, when "connected to" in the entire specification, this does not only mean that two or more constituent elements are directly connected, but also means that two or more constituent elements are indirectly connected, physically connected, and electrically connected through other constituent elements, or being referred to by different names depending on the position or function, while being integral.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

In the drawings, the symbol x used to indicate a first direction, y is a second direction that is perpendicular to the first direction, and z is a third direction that is perpendicular to the first direction and the second direction.

Referring to the accompanying drawings, a light emitting display device will be described as an example for an embodiment of a display device.

Figure 2:
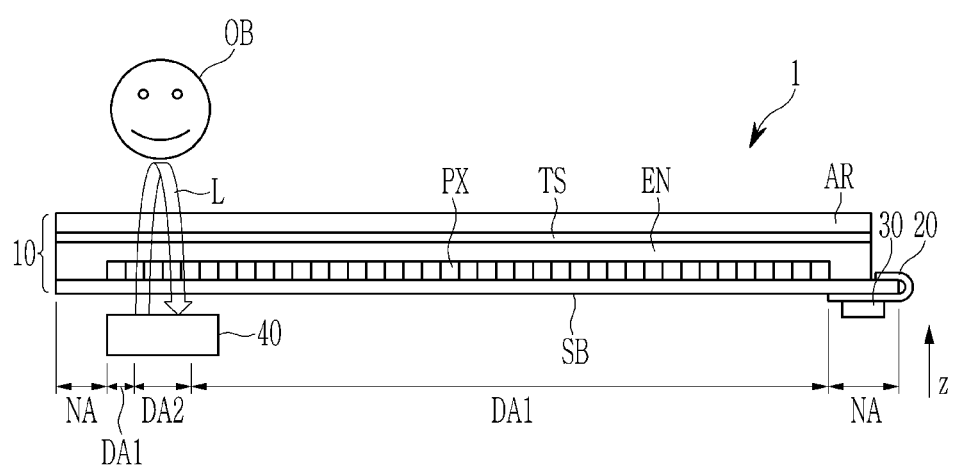
FIG. 2 is a schematic cross-sectional view of the embodiment of the display device 1.

FIG. 1 is a schematic top plan view of an embodiment of a display device 1, and FIG. 2 is a schematic cross-sectional view of the embodiment of the display device 1.

Referring to FIG. 1 and FIG. 2, a display device 1 may include a display panel 10, a flexible printed circuit film 20 connected to the display panel 10, a driver including an integrated circuit ("IC") chip 30 or the like, and an optical device 40.

The display panel 10 may include a display area DA where an image is displayed, and a non-display area NA that is disposed to surround the display area DA and where an image is not displayed. The display area DA may correspond to a screen. The display panel 10 displays an image and senses a touch.

A plurality of pixels PX is disposed in the display area DA. Here, the pixel PX is a minimum unit for displaying an image, and each pixel PX may display a predetermined color, for example, one of red, green, and blue with various levels of luminance.

In the non-display area NA, circuits and/or signals for generating and/or transmitting various signals applied to the display area DA are disposed. Each pixel PX is connected with signals lines such as a gate line, a data line, a driving voltage line, or the like, and thus the pixel PX may receive a gate signal, a data voltage, a driving voltage, or the like from the signal lines.

The display area DA includes a first display area DA1 and a second display area DA2. The second display area DA2 has higher transmittance than the first display area DA1 so as to provide functions other than a unique function of displaying an image. Here, transmittance implies transmittance of light transmitting through the display panel 10 in a third direction (z-axis). The light may be visible light and/or light with a wavelength other than visible light (e.g., infrared light). A density of the pixels PX and the number of pixels PX per unit area in the second display area DA2 is smaller than that of the first display area DA1.

The second display area DA2 may be variously disposed in the display area DA. In the illustrated embodiment, the second display area DA2 is disposed in the first display area DA1, while being surrounded by the first display area DA1.

The second display area DA2 may be disposed in contact with the non-display area NA. The second display area DA2 may be disposed in the left, right, and/or the center at an upper end of the display area DA. The second display area DA2 may be separated into two or more regions. The second display area DA2 may be disposed along a first direction (x-axis) completely across the upper end of the display area DA. The second display area DA2 may be disposed along a second direction (y-axis) across the left and/or right ends of the display area DA. The second display area DA2 may have various shapes such as polygons such as a quadrangle and a triangle, circles, and ellipses.

A driving unit that generates and/or processes various signals for driving the display panel 10 may be disposed in the non-display area NA of the display panel 10. The driving unit may include a data driver applying a data voltage to data lines, a gate driver applying a gate signal to gate lines, and a signal controller controlling the data driver and the gate driver.

The driving unit may be integrated to the display panel 10, or may be disposed on both opposite sides (e.g., left and right sides) or on one side. The data driver and the signal controller may be provided as IC chips (also referred to as driving IC chips) 30, and the IC chip 30 may be installed in the flexible printed circuit film 20 and thus be electrically connected to the display panel 10. The IC chip 30 may be installed in the non-display area NA of the display panel 10.

A touch sense area that may sense a touch may approximately match the display area DA. Touch electrodes TE (refer to FIG. 7) are arranged in the touch sense area. A single touch electrode TE may be disposed through the plurality of pixels PX. The touch electrodes TE may sense a user's contact or non-contact touch. Each touch electrode TE may sense a touch using a self-capacitor method, or adjacent touch electrodes TE may sense a touch using a mutual capacitor method. The display panel 10 may be also referred to as a touch screen panel. The display device 1 may include a touch driver that generates signals for driving the touch electrodes TE and processes signals received from the touch electrodes TE, and the touch driver may be provided as an IC chip.

The display panel 10 may include a substrate SB, and the plurality of pixels PX may be formed or disposed on the substrate SB. The substrate SB may be disposed continuously over the first display area DA1 and the second display area DA2.

The display panel 10 may include an encapsulation layer EN that covers all pixels PX. The encapsulation layer EN may prevent permeation of moisture or oxygen into the display panel 10 by sealing the first display area DA1 and the second display area DA2.

A touch sensor layer TS where the touch electrodes TE are arranged may be disposed on the encapsulation layer EN. The touch electrode TE may include a metal mesh. In an embodiment, the touch electrode TE may include a transparent conductive material such as an indium tin oxide ("ITO") or an indium zinc oxide ("IZO"). The touch electrode TE may be formed or provided as a single layer or a multiple layer.

An anti-reflection layer AR may be disposed on the touch sensor layer TS to reduce reflection of external light. The anti-reflection layer AR may include a polarization layer and/or a phase delay layer. The anti-reflection layer AR may include a light blocking member and a color filter.

The optical device 40 may be disposed in the rear side of the display panel 10 to be overlapped with the display panel 10. The optical device 40 may be a camera, a sensor, a flash, or the like. When the optical device 40 is a sensor, the optical device 40 may be a proximity sensor or an illuminance sensor. Light of the wavelength used by the optical device 40 may pass through the display panel 10 with higher transmittance through the second display area DA2. Various electronic devices other than the optical device 40 may be disposed in the rear side of the display panel 10.

The optical device 40 may emit light L of a predetermined wavelength range toward an object OB disposed in front of the display panel 10 or may receive light L reflected from the object OB. The light L of the predetermined wavelength range may be processed by the optical device 40, and may be visible light and/or infrared rays. The light of the predetermined wavelength may mainly pass through a transmissive region disposed in the second display area DA2. When the optical device 40 uses infrared light, light of the predetermined wavelength may have a wavelength region of about 900 nanometers (nm) to about 1000 nm. The optical device 40 may receive light of a predetermined wavelength irradiated to the front of the display panel 10. The optical device 40 may be disposed to correspond to the entire second display area DA2, or may be disposed to correspond to only a part of the second display area DA2. A plurality of optical devices 40 may be disposed in the second display area DA2.

Figure 3:
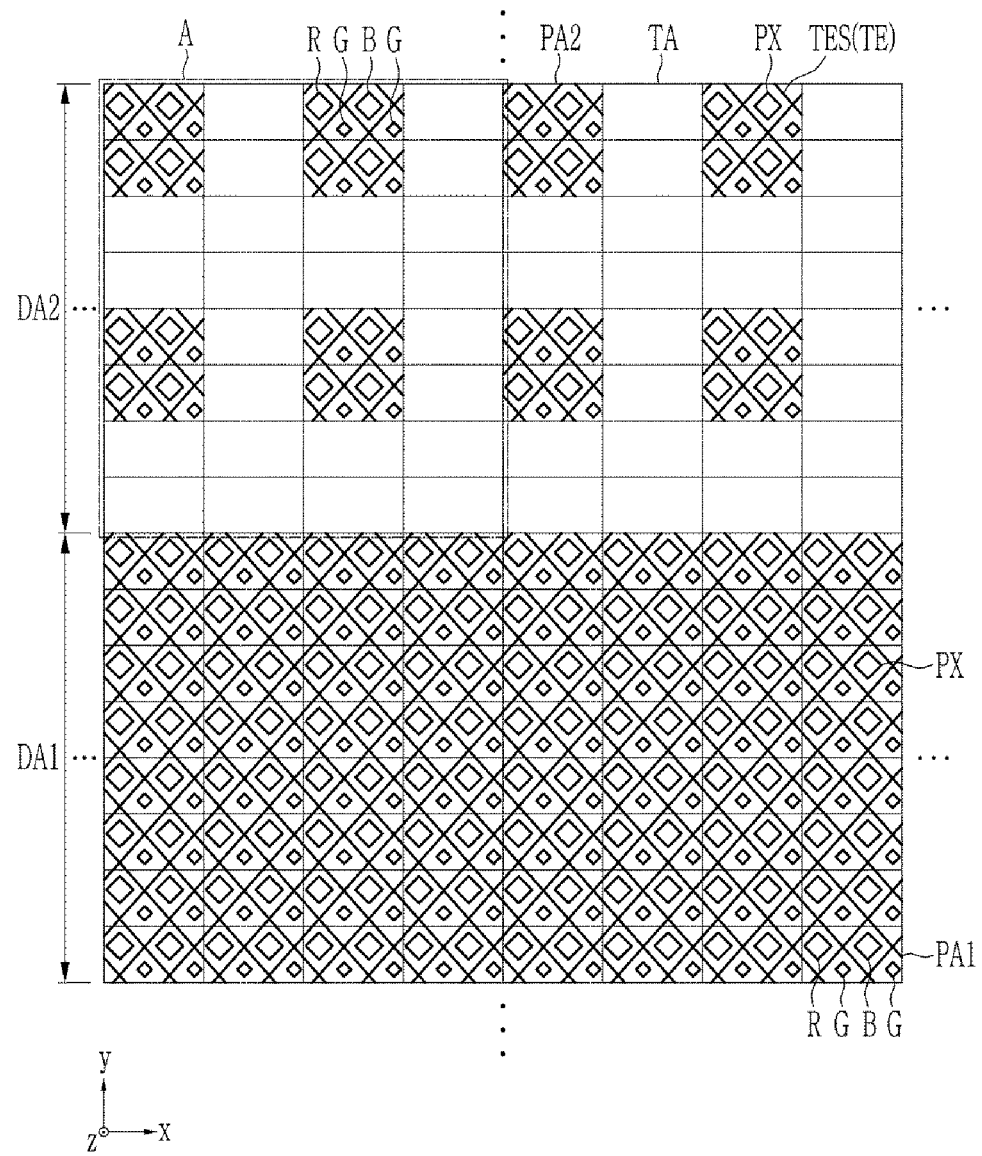
FIG. 3 is a schematic plan view of the embodiment of the first display area and the second display area of the display device.
Figure 4:
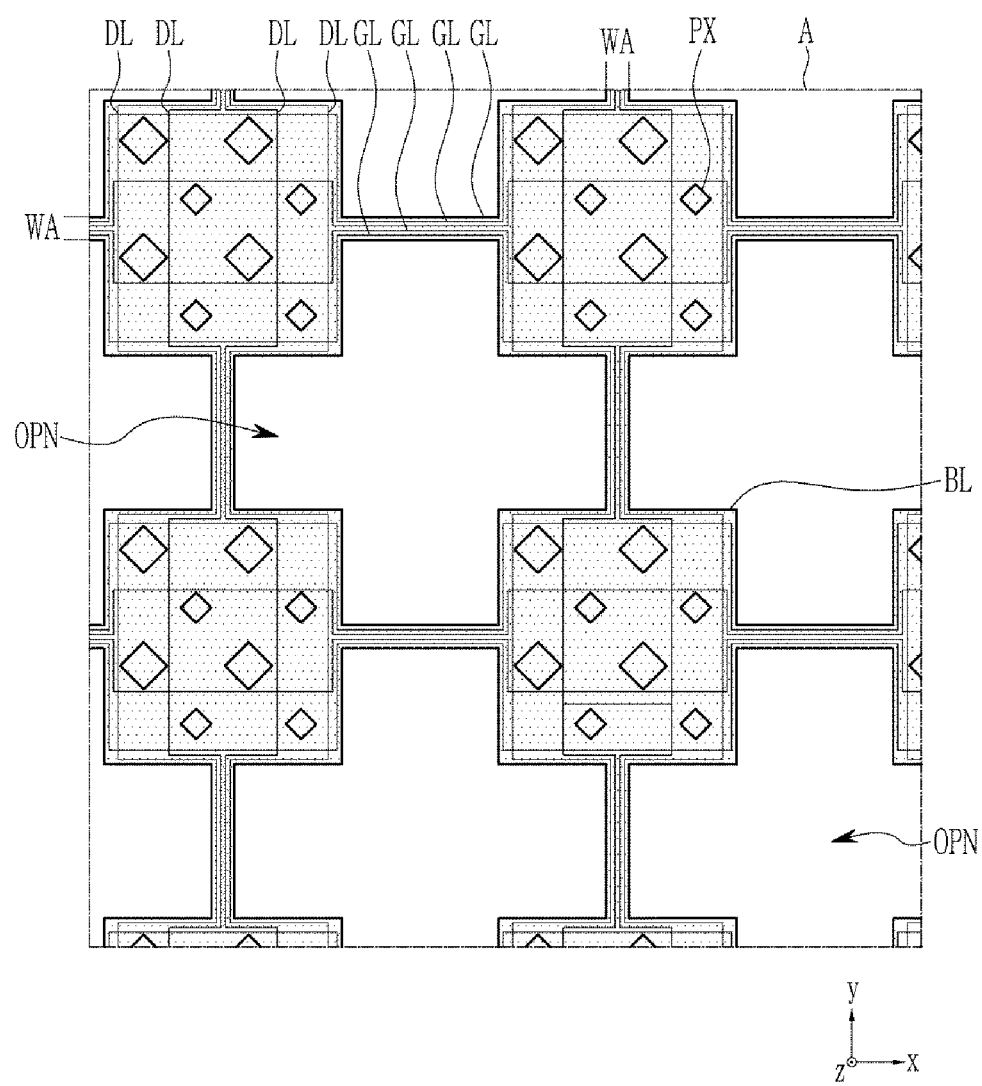
FIG. 4 is a schematic enlarged view of the region A in FIG. 3.

Next, referring to FIG. 3 and FIG. 4, the first display area and the second display area of the display device in the embodiment will be described in more detail. FIG. 3 is a schematic plan view of the embodiment of the first display area and the second display area of the display device, and FIG. 4 is a schematic enlarged view of the region A in FIG. 3.

The first pixel area PA1 and the second pixel area PA2 may respectively include one or more pixels PX. Each pixel PX may include a pixel circuit and a light emitting portion. The pixel circuit is a circuit for driving a light emitting element such as a light emitting diode LED (refer to FIG. 7), and may include a transistor, a capacitor, or the like. The light emitting portion is a region where light is emitted from the light emitting element.

The pixel PX shown in FIG. 3 may correspond to the light emitting portion. The light emitting portion may be a rhombus type, but may have various shapes such as a quadrangular (e.g., rectangular) shape and a circular shape. The pixel PX may emit light in one direction, that is, a third direction (z-axis). A touch electrode section TES may be disposed in the first pixel area PA1 and the second pixel area PA2. The touch electrode section TES may include a metal mesh in which metal wires are entangled like a net, and the metal mesh may be disposed so as to not cover the light emitting portion. A plurality of touch electrode sections TES may be connected to each other to form one touch electrode TE.

A transmissive area TA does not include a pixel circuit and a light emitting portion. In the transmissive area TA, the pixel circuit, the light emitting portion, and the touch electrode TE, which obstruct the transmission of light, are not disposed or are hardly disposed, and thus the transmittance is higher than that of the first and second pixel areas PA1 and PA2.

Wiring areas WA are disposed at the periphery of the second pixel areas PA2, and a plurality of signal lines GL and DL may be disposed in the first pixel area PA1, the second pixel area PA2, and the wiring area WA.

According to the embodiment illustrated in FIG. 3, each of the first pixel areas PA1 includes one red pixel R, two green pixels G, and one blue pixel B. Each of the second pixel areas PA2 includes one red pixel R, two green pixels G, and one blue pixel B. Unlike the illustrated embodiment, the pixel arrangement in the first pixel area PA1 and the pixel arrangement in the second pixel area PA2 may be different. When a set of pixels R, G, and B included in each pixel area PA1 and PA2 is referred to as a unit pixel, the configuration of the unit pixel of the first pixel area PA1 and the configuration of the unit pixel of the second pixel area PA2 may be the same as or different from each other. The unit pixel may include one red pixel R, one green pixel G, and one blue pixel B. The unit pixel may include at least one of the red pixel R, the green pixel G, and the blue pixel B, and may include a white pixel.

The pixels R, G, and B included in the first display area DA1 form a pixel row in a first direction (x-axis). The pixels R, G, and B included in the second display area DA2 also form a pixel row in the first direction (x-axis).

In each pixel row in the first display area DA1, pixels R, G, and B are approximately arranged in the first direction (x-axis). In each pixel row, the pixels R, G, and B may be iteratively arranged in the order of the red pixel R, the green pixel G, the blue pixel B, and the green pixel G in the first direction (x-axis). The pixels R, G, and B included in a single pixel row may be variously arranged. In an embodiment, the pixels R, G, and B may be iteratively arranged in the order of the blue pixel B, the green pixel G, the red pixel R, and the green pixel G or in the order of the red pixel R, the blue pixel B, the green pixel G, and the blue pixel B, for example.

In each pixel row in the second display area DA2, pixels R, G, and B are roughly arranged in a row in the first direction (x-axis). In each pixel row, pixels R, G, and B may be repeatedly arranged in the order of the red pixel R, the green pixel G, the blue pixel B, and the green pixel G in the first direction (x-axis). The pixels R, G, and B included in a single pixel row may be variously arranged.

The pixels R, G, and B of the first and second pixel areas PA1 and PA2 also form a pixel column in the second direction (y-axis). In each pixel column, pixels R, G, and B are roughly arranged in a column in the second direction (y-axis). In each pixel column, pixels PX of the same color may be disposed, and pixels PX of two or more colors may be disposed alternately in the second direction (y-axis). The pixels R, G, and B included in a single pixel column may be variously arranged.

The pixels R, G, and B of the second pixel area PA2 may be of a cross-section light emission type, for example, a front light emission type that emits light in the third direction (z-axis). The pixels R, G, and B of the second pixel area PA2 may be of a bottom emission type or a double-sided light emission type.

Referring to FIG. 4, in the second display area DA2, the second pixel area PA2 and the transmissive area TA are adjacent to each other, and the second pixel area PA2 includes pixels R, G, and B. Gate lines GL that transmit gate signals to the pixels R, G, and B may extend approximately in the first direction (x-axis), and data lines DL that transmit data lines may extend approximately in the second direction (y-axis). One data line DL may be disposed in each pixel column. Each of the data lines DL may extend over the first display area DA1 and the second display area DA2. Two or more gate lines GL that may transmit different timing gate-on voltages may be provided in each pixel row. Unlike the illustrated embodiment, a plurality of data lines DL may be provided to each pixel column, or one data line DL may be provided to a plurality of pixel columns.

The gate line GL and the data line DL may be disposed in the wiring area WA that is disposed at a boundary of adjacent transmissive areas TA to thereby prevent transmittance of the transmissive area TA from being deteriorated due to the gate line GL and the data line DL.

A blocking layer BL is disposed in the second pixel area PA2, and an opening OPN that is defined in the transmissive area TA is defined in the blocking layer BL. The blocking layer BL may also be disposed in the wiring area WA. The blocking layer BL is also disposed in the wiring area WA that surrounds the periphery of the transmissive area TA and thus light transmitted through the transmissive area TA may be prevented from being diffracted around the transmissive area TA, thereby preventing deterioration of the optical device 40 due to the surrounding light.

According to the embodiment of FIG. 4, the opening OPN of the blocking layer BL has an approximately cross-shaped planar shape, and sizes of the upper protruding portion, the lower protruding portion, the left protruding portion, and the right protruding portion of the cross-shaped opening OPN may be approximately the same as each other. However, differently, the upper protruding portion, the lower protruding portion, the left protruding portion, and the right protruding portion of the cross-shaped opening OPN may have different sizes from one another.

The blocking layer BL may include a metal, and prevents light from the outside from being introduced into the second pixel area PA2 and prevents light transmitting through the transmissive area TA from diffracting at the periphery of the transmissive area TA.

Since the opening OPN of the blocking layer BL has the cross-sectional shape of which the upper protruding portion, the lower protruding portion, the left protruding portion, and the right protruding portion have approximately the same size as each other, it is possible to reduce the effect of light diffraction that may occur around the opening OPN of the blocking layer BL.

The blocking layer BL is disposed to overlap with the wiring area WA where signal lines transmitting signals to the second pixel area PA2 are disposed, and thus prevents introduction of light to the signal lines disposed to the wiring area WA and prevents the light from being reflected from surfaces of the signal lines and being visible from the transmissive area TA.

Figure 5:
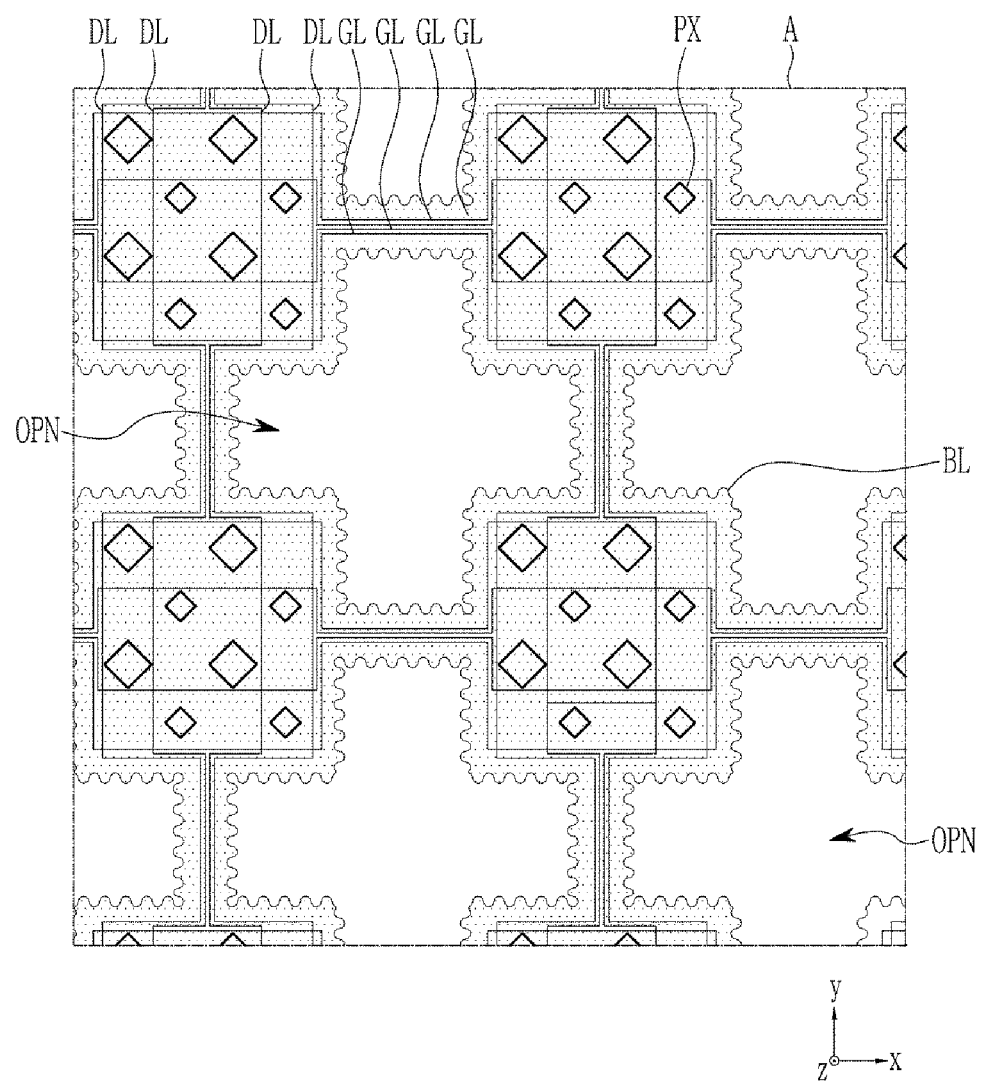
FIG. 5 is a schematic top plan view of another embodiment of a part of a second pixel area of a display device.

Next, referring to FIG. 5, arrangement of second pixel areas PA2 of a display device in another embodiment will be described. FIG. 5 is a schematic top plan view of another embodiment of a part of a second pixel area of a display device.

According to the embodiment of FIG. 5, an opening OPN of a blocking layer BL has an approximately cross-shaped planar shape, and the upper protruding portion, the lower protruding portion, the left protruding portion, and the right protruding portion of the cross-shaped opening OPN may have approximately the same sizes as each other. In addition, edges of the opening OPN of the blocking layer BL may not be a straight line, but may have an embossed shape in which the recess portion and the convex portion are repeated.

The blocking layer BL may include a metal, and prevents light from the outside from being introduced into a second pixel area PA2 and prevents light transmitting through a transmissive area TA from diffracting at the periphery of the transmissive area TA.

Since the opening OPN of the blocking layer BL has the cross-sectional shape of which the upper protruding portion, the lower protruding portion, the left protruding portion, and the right protruding portion have approximately the same size as each other, and the edge of the opening OPN of the blocking layer BL is defined not in a straight line shape, but in an embossed shape in which the recess portion and the convex portion are repeated, it is possible to reduce the effect of light diffraction that may occur around the opening OPN of the blocking layer BL.

The blocking layer BL is disposed to overlap with the wiring area WA where signal lines transmitting signals to the second pixel area PA2 are disposed, and thus prevents introduction of light to the signal lines disposed to the wiring area WA and prevents the light from being reflected from surfaces of the signal lines and being visible from the transmissive area TA.

Figure 6:
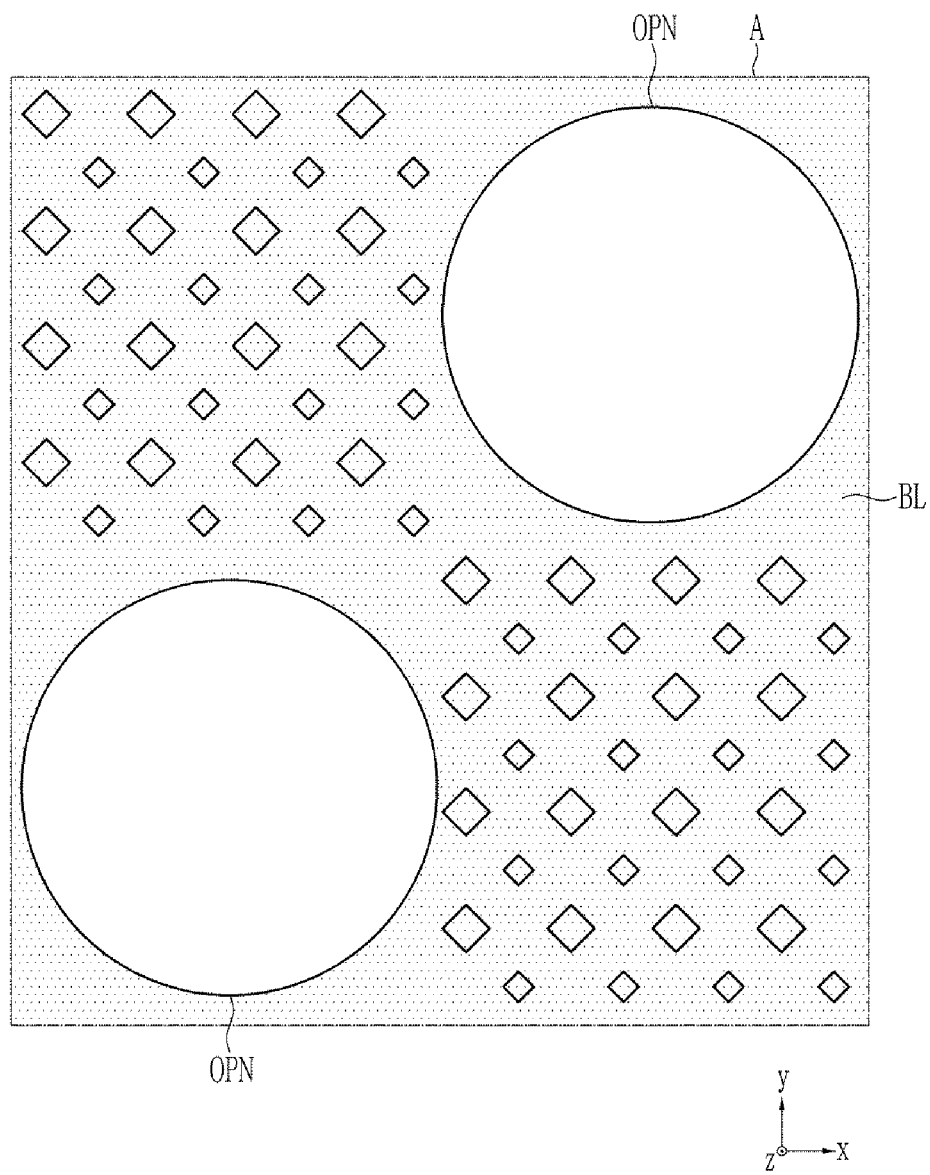
FIG. 6 is a schematic top plan view of another embodiment of a part of a second pixel area of a display device.

Next, referring to FIG. 6, arrangement of second pixel areas PA2 of a display device in another embodiment will be described. FIG. 6 is a schematic top plan view of another embodiment of a part of a second pixel area of a display device.

In an embodiment of FIG. 6, an opening of the blocking layer BL has an approximately circular shape. The opening OPN of the blocking layer BL may have a flat shape such as an oval.

The blocking layer BL may include a metal, and prevents light from the outside from being introduced into a second pixel area PA2 and prevents light transmitting through a transmissive area TA from diffracting at the periphery of the transmissive area TA.

Since the opening OPN of the blocking layer BL is approximately defined in the shape of a circle, it is possible to reduce the effect of light diffraction that may occur around the opening OPN of the blocking layer BL.

The blocking layer BL is disposed to overlap with the wiring area WA where signal lines transmitting signals to the second pixel area PA2 are disposed, and thus prevents introduction of light to the signal lines disposed to the wiring area WA and prevents the light from being reflected from surfaces of the signal lines and being visible from the transmissive area TA.

Figure 7:
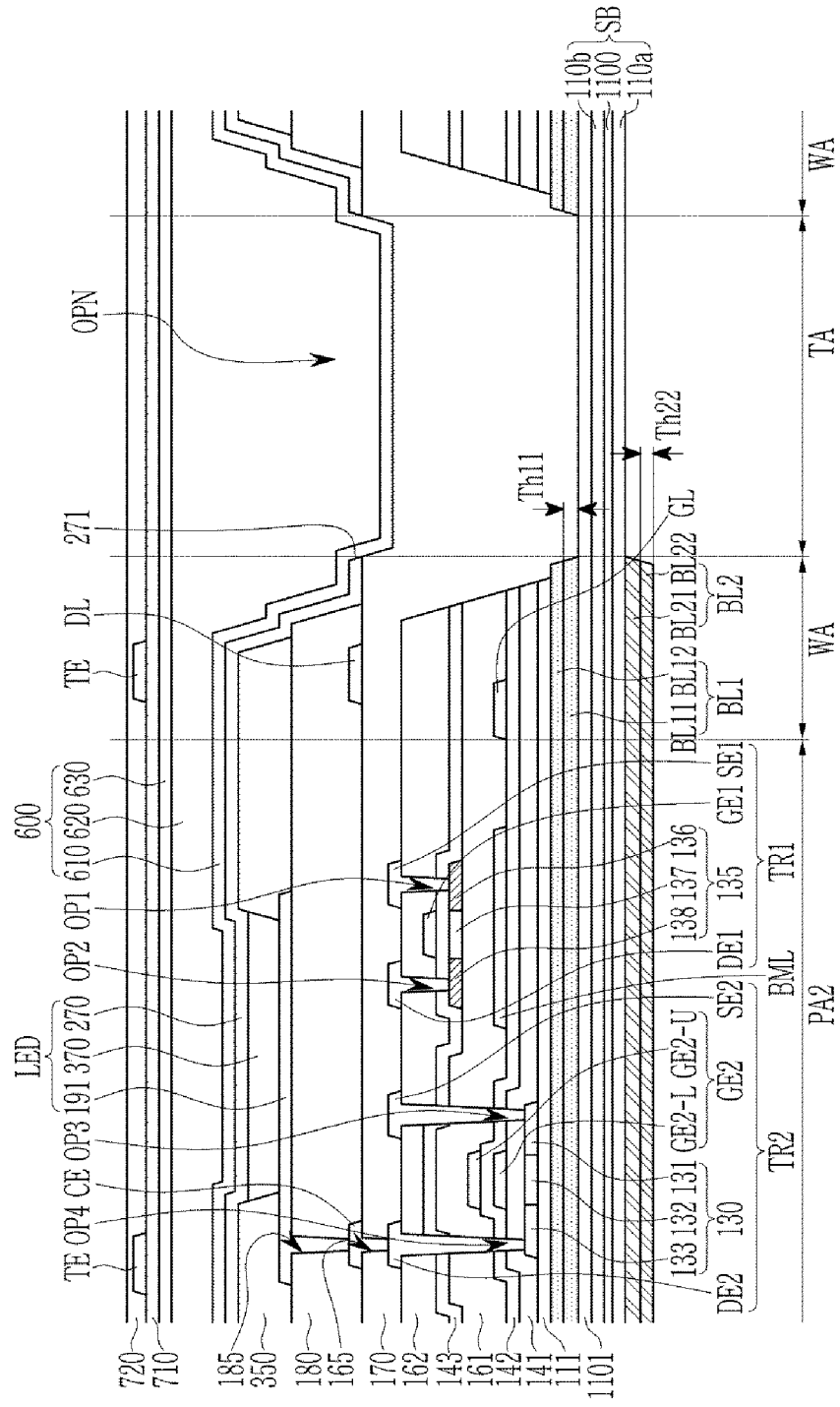
FIG. 7 is a cross-sectional view of an embodiment of a part of a second display area of a display device.

Next, referring to FIG. 7, an interlayer structure of a display device in an embodiment will be described in more detail. FIG. 7 is a cross-sectional view of an embodiment of a part of a second display area of a display device.

In an embodiment shown in FIG. 7, for better comprehension and ease of description, a first transistor TR1, second transistor TR2, and a light emitting diode LED connected to the second transistor TR2 are mainly illustrated, but the invention is not limited thereto. Transistors other than the first transistor TR1 and the second transistor TR2 may be included. The first transistor TR1 may be a switching transistor and the second transistor TR2 may be a driving transistor, but the invention is not limited thereto.

A display device in the illustrated embodiment includes the first transistor TR1, the second transistor TR2, and the light emitting diode LED, and includes second pixel areas PA2 where an image may be displayed, a transmissive area TA, and wiring areas WA disposed at the periphery of the second pixel areas PA2.

A substrate SB may include a polymer such as a polyimide, a polyamide, or the like, or an insulating material such as glass, and may be optically transparent.

The substrate SB may include a first layer 110a, a second layer 110b, and a first barrier layer 1100 that is disposed between the first layer 110a and the second layer 110b.

The first layer 110a and the second layer 110b may be transparent. The first layer 110a and the second layer 110b may include a polymer such as a polyimide, a polyamide, or the like. In an embodiment, the first layer 110a and the second layer 110b may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

In an embodiment, the first barrier layer 1100 may prevent permeation of moisture or the like, and may include, for example, an inorganic insulating material such as a silicon oxide ($SiO_x$), a silicon nitride ($SiN_x$), and a silicon oxynitride ($SiO_xN_y$). The first barrier layer 1100 may include amorphous silicon (Si).

A second barrier layer 1101 is disposed on the substrate SB. The second barrier layer 1101 serves to flatten the surface while preventing penetration of unnecessary components such as an impurity or moisture simultaneously. The second barrier layer 1101 may include at least one of a silicon oxide, a silicon nitride, a silicon oxide, and amorphous silicon.

A first blocking layer BL1 is disposed on the second barrier layer 1101 and a second blocking layer BL2 is disposed below the substrate SB. The first blocking layer BL1 and the second blocking layer BL2 may prevent visual recognition due to inflow of light from the lower portion of the substrate SB. In particular, the first blocking layer BL1 and the second blocking layer BL2 are disposed in the second pixel area PA2 and the wiring area WA, excluding the transmissive area TA to prevent a light leakage at the periphery of the transmissive area TA, thereby preventing performance deterioration due to unnecessary external light of an electronic device disposed below the transmissive area TA. The first blocking layer BL1 and the second blocking layer BL2 may be aligned with each other in the vertical direction and the third direction (z-axis). However, the first blocking layer BL1 and the second blocking layer BL2 may not be aligned in a line along the vertical direction and the third direction (z-axis).

The first blocking layer BL1 includes a first layer BL11 disposed on the second barrier layer 1101 and a second layer BL12 disposed on the first layer BL11, and the second blocking layer BL2 includes a third layer BL21 disposed below the substrate SB and a fourth layer BL22 disposed below the third layer BL21.

The first layer BL11 of the first blocking layer BL1 may include amorphous silicon. The second layer BL12 of the first blocking layer BL1 may include a metal. In an embodiment, the second blocking layer BL2 of the blocking layer BL may include molybdenum (Mo), aluminum (Al), titanium (Ti), copper (Cu), or the like, for example.

In an embodiment, a thickness Th11 of the first layer BL11 of the first blocking layer BL1 in the third direction (z-axis), which is a direction perpendicular to a main plane extension direction of the substrate SB, may be larger than about 20 angstroms (Å) and smaller than about 300 Å.

An absorption coefficient (k) of the second layer BL12 of the first blocking layer BL1 may be larger than an absorption coefficient (k) of the first layer BL11 of the first blocking layer BL1. In an embodiment, the absorption coefficients of the first layer BL11 and the second layer BL12 may be measured with reference to a visible light region, for example, light in a wavelength range of about 380 nm to about 780 nm.

As described, since the first blocking layer BL1 includes the first layer BL11 having a small absorption coefficient (k) value and the second layer BL12 having a large absorption coefficient (k), light that has passed through the first layer BL11 of the first blocking layer BL1 may be absorbed by the second layer BL12 with a large absorption coefficient, and a part of the light reflected from the surface of the second layer BL12 interferes with the light reflected from the first layer BL11 such that light inflowing from the lower part of the display device is reflected from the first blocking layer BL1 to prevent inflow toward the optical device disposed under the substrate SB.

In an embodiment, the third layer BL21 of the second blocking layer BL2 may be a molybdenum tantalum oxide (MoTaOx), and a tantalum content included in the third layer BL21 of the second blocking layer BL2 may be about 8 wt % or more. When the third layer BL21 of the second blocking layer BL2 is a molybdenum tantalum oxide (MoTaOx) and a tantalum content included in the third layer BL21 of the second blocking layer BL2 is about 8 wt % or more, an optical characteristic of the first blocking layer BL1 may be maintained even after a high temperature process of about 450 degrees Celsius (° C.).

In an embodiment, a thickness of the third layer BL21 of the second blocking layer BL2 in the third direction (z-axis) may be about 400 nm to about 700 nm. In an embodiment, a refractive index of the third layer BL21 of the second blocking layer BL2 may be about 2 to about 3, more specifically about 2.2 to about 2.6, more specifically about 2.46, and an extinction coefficient of the third layer BL21 of the second blocking layer BL2 may be about 0.5 to about 0.9, more specifically about 0.67.

In an embodiment, the fourth layer BL22 of the second blocking layer BL2 may include a silicon oxide, and a thickness Th22 of the fourth layer BL22 of the second blocking layer BL2 in the third direction (z-axis) may be in a range of about 20 Å to about 300 Å.

As described, since the extinction coefficient of the third layer BL21 of the second blocking layer BL2 is about 0.5 to about 0.9, more specifically, about 0.67, light inflow from the lower portion of the display device may be absorbed in the third layer BL21 of the second blocking layer BL2 and light that is not absorbed and is reflected from the third layer BL21 of the second blocking layer BL2 is reflected from the fourth layer BL22 of the second blocking layer BL2 by being interfered with each other with light, and thus light inflow from the lower portion of the display device is reflected from the second blocking layer BL2 and inflow to the optical device disposed below the substrate SB may be prevented.

In the display device in the embodiment, the first blocking layer BL1 disposed above the substrate SB and the second blocking layer BL2 disposed below the substrate SB are included and thus light incident from a lower portion of the display device may be prevented from passing through the substrate SB and being incident on a light emitting portion or being viewed at the periphery of the transmissive area TA, and simultaneously preventing the light incident from the lower portion of the display device from being reflected by the first blocking layer BL1 and the second blocking layer BL2 and thus being incident toward the optical device disposed below the substrate, thereby preventing quality deterioration of the optical device due to inflow of unnecessary external light.

A buffer layer 111 may be disposed on the second barrier layer 1101 and the first blocking layer BL1. The buffer layer 111 may have a single-layer or multi-layer structure. In an embodiment, the buffer layer 111 may include a silicon nitride ($SiN_x$), a silicon oxide ($SiO_x$), a silicon oxynitride (SiOxNy), or the like.

A second semiconductor 130 may be disposed on the buffer layer 111. The second semiconductor 130 may include a polysilicon material. That is, the second semiconductor 130 may include a polycrystalline semiconductor. The second semiconductor 130 may include a channel region 132, and a source region 131 and a drain region 133 that are disposed at opposite sides of the channel region 132.

The source region 131 of the second semiconductor 130 may be connected with a second source electrode SE2, and the drain region 133 of the second semiconductor 130 may be connected with a second drain electrode DE2.

A first gate insulating layer 141 may be disposed on the second semiconductor 130. The first gate insulating layer 141 may have a single-layer or multi-layer structure including a silicon nitride, a silicon oxide, a silicon oxynitride, or the like.

A second gate lower electrode GE2-U may be disposed on the first gate insulating layer 141. In an embodiment, the second gate lower electrode GE2-U may include molybdenum (Mo), aluminum (Al), copper (Cu), and/or titanium (Ti), and may have a single-layer or multi-layer structure.

A second gate insulating layer 142 may be disposed on the second gate lower electrode GE2-U. The second gate insulating layer 142 may include a silicon nitride, a silicon oxide, a silicon oxynitride, or the like. In an embodiment, the second gate insulating layer 142 may include molybdenum (Mo), aluminum (Al), copper (Cu), and/or titanium (Ti), and may have a single-layer or multi-layer structure.

A second gate upper electrode GE2-L and a gate line GL may be disposed on the second gate insulating layer 142. The second gate lower electrode GE2-U and the second gate upper electrode GE2-L may overlap each other, while disposing the second gate insulating layer 142 therebetween. The second gate upper electrode GE2-L and the second gate lower electrode GE2-U form a second gate electrode GE2. The second gate electrode GE2 may overlap the channel region 132 of the second semiconductor 130 in a direction that is perpendicular to the substrate 110. In an embodiment, the second gate upper electrode GE2-L and the gate line GL may include molybdenum (Mo), aluminum (Al), copper (Cu) silver (Ag), chromium (Cr), tantalum (Ta), titanium (Ti), or the like, and may have a single-layer or multi-layer structure.

A metal blocking layer BML that includes the same layer as the second gate upper electrode GE2-L and the gate line GL may be disposed on the second gate insulating layer 142, and the metal blocking layer BML may overlap a first transistor TR1, which will be described later.

The second semiconductor 130, the second gate electrode GE2, the second source electrode SE2, and the second drain electrode DE2 form a second transistor TR2. The second transistor TR2 may be a driving transistor connected with a light emitting diode LED, and may include a transistor including a polycrystalline semiconductor.

A first inter-insulating layer 161 may be disposed on the second gate electrode GE2. The first inter-insulating layer 161 may include a silicon nitride, a silicon oxide, a silicon oxynitride, or the like. The first inter-insulating layer 161 may include a multilayer in which a layer including a silicon nitride and a layer including a silicon oxide are stacked. In this case, the layer including the silicon oxynitride may be disposed closer to the substrate SB than the layer including the silicon oxide in the first inter-insulating layer 161 is to the substrate SB.

A first semiconductor layer (also referred to as a first semiconductor) 135 may be disposed on the first inter-insulating layer 161. The first semiconductor 135 may overlap the metal blocking layer BML.

The first semiconductor 135 may include an oxide semiconductor. In an embodiment, the oxide semiconductor may include at least one of a one-element metal oxide such as indium (In) oxide, tin oxide (Sn), or zinc oxide (Zn), a binary metal oxide such as In—Zn oxide, Sn—Zn oxide, Al—Zn oxide, Zn—Mg oxide, Sn—Mg oxide, In—Mg oxide, or In—Ga oxide, a tertiary metal oxide such as In—Ga—Zn oxide, In—Al—Zn oxide, In—Sn—Zn oxide, Sn—Ga—Zn oxide, Al—Ga—Zn oxide, Sn—Al—Zn oxide, In—Hf—Zn oxide, In—La—Zn oxide, In—Ce—Zn oxide, In—Pr—Zn oxide, In—Nd—Zn oxide, In—Sm—Zn oxide, In—Eu—Zn oxide, In—Gd—Zn oxide, In—Tb—Zn oxide, In—Dy—Zn-based oxide, In—Ho—Zn-based oxide, In—Er—Zn-based oxide, In—Tm—Zn-based oxide, In—Yb—Zn-based oxide, or In—Lu—Zn-based oxide, and a quaternary metal oxide such as In—Sn—Ga—Zn oxide, In—Hf—Ga—Zn oxide, In—Al—Ga—Zn oxide, In—Sn—Al—Zn oxide, In—Sn—Hf—Zn oxide, or In—Hf—Al—Zn oxide. In an embodiment, the first semiconductor 135 may include an indium-gallium-zinc oxide ("IGZO") among the In—Ga—Zn-based oxides, for example.

The first semiconductor 135 may include a channel region 137, and a source region 136 and a drain region 138 disposed at opposite sides of the channel region 137. The source region 136 of the first semiconductor 135 may be connected with a first source electrode SE1, and the drain region 138 of the first semiconductor 135 may be connected with a first drain electrode DE1.

Figure 14:
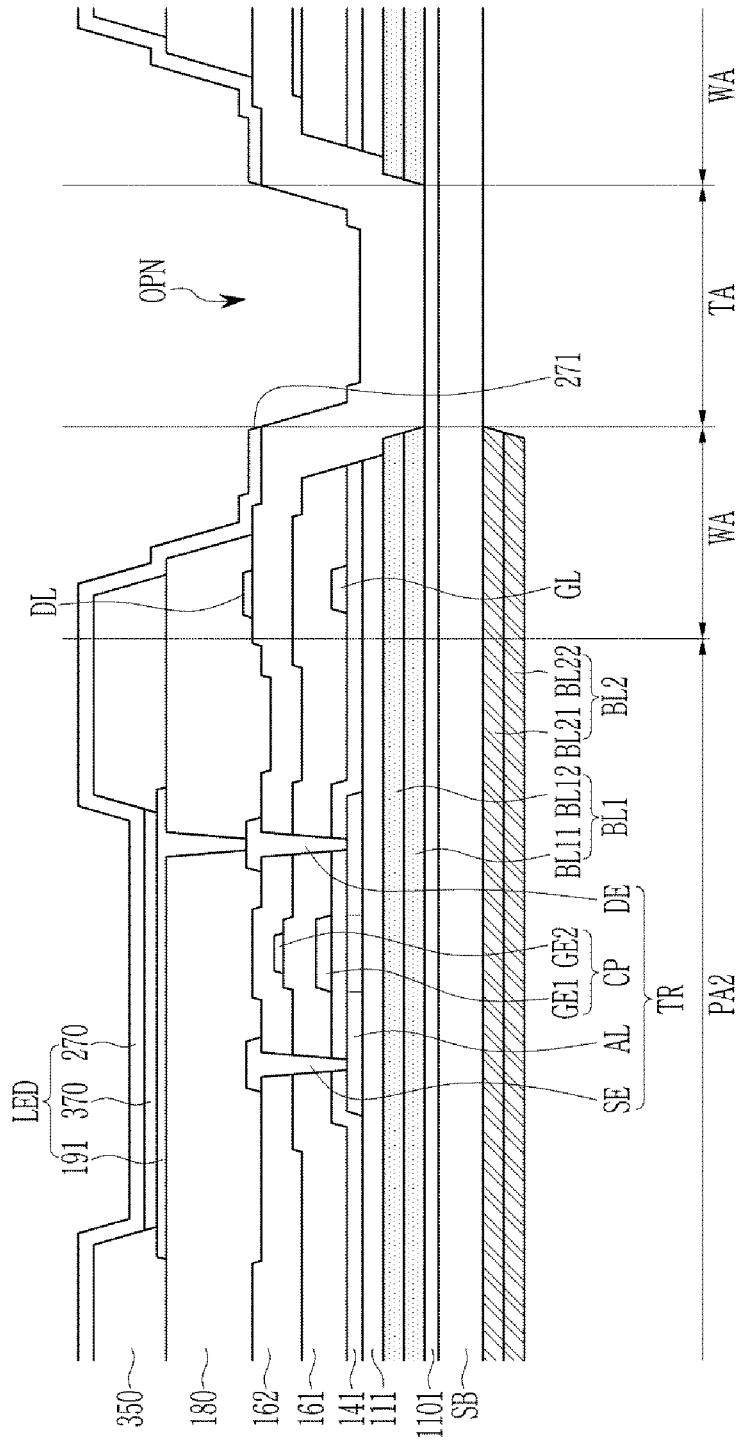
FIG. 14 is a cross-sectional view of another embodiment of a second display area of a display device.

A third gate insulating layer 143 may be disposed on the first semiconductor 135. The third gate insulating layer 143 may include a silicon nitride, a silicon oxide, a silicon oxynitride, or the like. In the embodiment of FIG. 14, the third gate insulating layer 143 may be disposed on the entire first semiconductor 135 and first inter-insulating layer 161. Thus, the third gate insulating layer 143 covers the top and side surfaces of the source region 136, the channel region 137, and the drain region 138 of the first semiconductor 135.

In the process of implementing high resolution, a size of each pixel decreases, and accordingly, a length of the semiconductor channel decreases. In this case, when the third gate insulating layer 143 does not cover the upper surfaces of the source region 136 and the drain region 138, some material of the first semiconductor 135 may move to the side of the third gate insulating layer 143. In the illustrated embodiment, since the third gate insulating layer 143 is disposed on the entire surface of the first semiconductor 135 and the first inter-insulating layer 161, it is possible to prevent a short circuit between the first semiconductor 135 and the first gate electrode GE1 due to diffusion of metal particles.

However, the invention is not limited thereto, and the third gate insulating layer 143 may not be disposed on the entire first semiconductor 135 and first inter-insulating layer 161. In an embodiment, the third gate insulating layer 143 may be disposed only between the first gate electrode GE1 and the first semiconductor 135, for example. That is, the third gate insulating layer 143 may overlap the channel region 137 of the first semiconductor 135, and may not overlap the source region 136 and the drain region 138.

The first gate electrode GE1 may be disposed on the third gate insulating layer 143. The first gate electrode GE1 may overlap the channel region 137 of the first semiconductor 135 in a direction that is perpendicular to the substrate 110. In an embodiment, the first gate electrode GE1 may include molybdenum (Mo), aluminum (Al), copper (Cu), and/or titanium (Ti), and may have a single-layer or multi-layer structure. In an embodiment, the first gate electrode GE1 may include a lower layer including titanium and an upper layer including molybdenum, and the lower layer including titanium may prevent diffusion of fluorine (F), which is an etching gas, during dry etching of the upper layer, for example.

The first semiconductor 135, the first gate electrode GE1, the first source electrode SE1, and the first drain electrode DE1 form a first transistor TR1. The first transistor TR1 may be a switching transistor for switching of the second transistor TR2, and may be formed or provided as a transistor including an oxide semiconductor.

A second inter-insulating layer 162 may be disposed on the first gate electrode GE1. The second inter-insulating layer 162 may include a silicon nitride, a silicon oxide, a silicon oxynitride, or the like. The second inter-insulating layer 162 may include a multilayer in which a layer including a silicon nitride and a layer including a silicon oxide are stacked.

A first source electrode SE1 and a first drain electrode DE1, and a second source electrode SE2 and a second drain electrode DE2, may be disposed on the second inter-insulating layer 162. In an embodiment, the first source electrode SE1, the first drain electrode DE1, the second source electrode SE2, and the second drain electrode DE2 may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may have a single-layer or multi-layer structure including the same. In an embodiment, the first source electrode SE1, the first drain electrode DE1, the second source electrode SE2, and the second drain electrode DE2 may have a triple-layer structure of a lower layer including refractory metals such as molybdenum, chromium, tantalum, and titanium, or an alloy thereof, an interlayer including an aluminum-based metal with low resistivity, a silver-based metal, and a copper-based metal, and an upper layer including refractory metals such as molybdenum, chromium, tantalum, and titanium, for example.

A first opening OP1 and a second opening OP2 are defined in the second inter-insulating layer 162 and the third gate insulating layer 143, and a third opening OP3 and a fourth opening OP4 may be defined in the second inter-insulating layer 162, the third gate insulating layer 143, the first inter-insulating layer 161, the second gate insulating layer 142, and the first gate insulating layer 141. The first opening OP1 may overlap the first source electrode SE1, and the second opening OP2 may overlap the first drain electrode DE1. The third opening OP3 may overlap the second source electrode SE2, and the fourth opening OP4 may overlap the second drain electrode DE2.

The first source electrode SE1 may be connected with the source region 136 of the first semiconductor 135 through the first opening OP1. The first drain electrode DE1 may be connected with the drain region 138 of the first semiconductor 135 through the second opening OP2.

The second source electrode SE2 may be connected with the source region 131 of the second semiconductor 130 through the third opening OP3. The second drain electrode DE2 may be connected with the drain region 133 of the second semiconductor 130 through the fourth opening OP4.

The first planarization layer 170 may be disposed on the first source electrode SE1, the first drain electrode DE1, the second source electrode SE2, and the second drain electrode DE2. The first planarization layer 170 may be an organic layer. In an embodiment, the first planarization layer 170 may include an organic insulating material such as a general-purpose polymer such as poly(methyl methacrylate) ("PMMA") or polystyrene ("PS"), a polymer derivative having a phenolic group, an acryl-based polymer, an imide-based polymer, a polyimide, an acryl-based polymer, and a siloxane-based polymer, for example.

A connection electrode CE and a data line DL may be disposed on the first planarization layer 170. In an embodiment, the connection electrode CE and the data line DL may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), and may have a single-layer or a multi-layer structure.

A first contact hole 165 is defined in the first planarization layer 170, and the connection electrode CE is connected with the second drain electrode DE2 through the first contact hole 165.

A second planarization layer 180 may be disposed on the first planarization layer 170, the connection electrode CE, and the data line DL. The second planarization layer 180 may serve to remove a step and planarize the surface for improving light emission efficiency of a light emitting element, which will be formed or provided thereon. In an embodiment, the second planarization layer 180 may include an organic insulating material such as a general-purpose polymer such as PMMA or PS, a polymer derivative having a phenolic group, an acryl-based polymer, an imide-based polymer, a polyimide, an acryl-based polymer, and a siloxane-based polymer.

A second contact hole 185 may be defined in the second planarization layer 180. The second contact hole 185 of the second planarization layer 180 may overlap the second drain electrode DE2.

An anode 191 may be disposed on the second planarization layer 180. The anode 191 may be connected with the second drain electrode DE2 through the second contact hole 185 of the second planarization layer 180.

The anode 191 may be provided individually in each pixel PX. In an embodiment, the anode 191 may include a metal such as silver (Ag), lithium (Li), calcium (Ca), aluminum (Al), magnesium (Mg), and gold (Au), or may include a transparent conductive oxide ("TCO") such as an ITO, an IZO, or the like.

A pixel defining layer 350 may be disposed on the anode 191. In an embodiment, the pixel defining layer 350 may include an organic insulating material such as a general-purpose polymer such as PMMA or PS, a polymer derivative having a phenolic group, an acryl-based polymer, an imide-based polymer, a polyimide, an acryl-based polymer, and a siloxane-based polymer.

An opening is defined in the pixel defining layer 350, and the opening of the pixel defining layer 350 may overlap the anode 191. A light emitting element layer 370 may be disposed in the opening of the pixel defining layer 350.

The light emitting element layer 370 may include a material layer that uniquely emits light of basic colors such as red, green, and blue. The light emitting element layer 370 may have a structure in which a plurality of material layers emitting light of different colors is stacked.

A cathode 270 may be disposed on the light emitting element layer 370 and the pixel defining layer 350. The cathode 270 may be provided in common to all pixels PX and may be applied with a common voltage. In an embodiment, the cathode 270 may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), calcium (Ca), or the like, or may include a TCO such as an ITO, an IZO, or the like.

The cathode 270 is removed in the transmissive area TA, and thus an edge 271, which is an end portion of the cathode 270, may be aligned with an edge of the first blocking layer BL1 or an edge of the second blocking layer BL2 in a vertical direction, that is, a third direction (z-axis). As described, since the cathode 270 is removed in the transmissive area TA, transmittance of the transmissive area TA may be improved.

The anode 191, the light emitting element layer 370, and the cathode 270 form the light emitting diode LED.

The first transistor TR1, which is a part of a switching transistor of the display device in the embodiment, may include an oxide semiconductor, and the second transistor TR2, which is a driving transistor, may include a polycrystalline semiconductor. For high-speed driving, a motion of a motion picture may be expressed more naturally by increasing an existing frequency of about 60 hertz (Hz) to about 120 Hz, but this increases the driving voltage. A frequency when driving a still image may be lowered to compensate for the increased driving voltage. In an embodiment, a still image may be driven at about 1 Hz, for example. When the frequency is lowered, a leakage current may occur. In the display device in the embodiment, the first transistor TR1, which is the switching transistor, includes a semiconductor oxide to thereby minimize a leakage current. In addition, the second transistor TR2, which is the driving transistor, includes a polycrystalline semiconductor to thereby acquire high electron mobility. That is, the switching transistor and the driving transistor include different semiconductor materials, it may drive more stably and have high reliability.

The first blocking layer BL1 and the second blocking layer BL2 that are disposed in the second pixel area PA2 are also disposed in the wiring area WA. The gate line GL and the data line DL may be disposed in the wiring area WA.

In the transmissive area TA, the first gate insulating layer 141, the second gate insulating layer 142, the first inter-insulating layer 161, the third gate insulating layer 143, and the second inter-insulating layer 162 that are disposed in the second pixel area PA2 may be removed. In addition, in the transmissive area TA, the second planarization layer 180 and the pixel defining layer 350 that are disposed in the second pixel area PA2 may be removed. However, the invention is not limited thereto, and at least one of the first gate insulating layer 141, the second gate insulating layer 142, the first inter-insulating layer 161, the third gate insulating layer 143, and the second inter-insulating layer 162 disposed in the second pixel area PA2 may be removed in the transmissive area TA, and at least a part of the second inter-insulating layer 162 and the second planarization layer 180 disposed in the second pixel area PA2 may not be removed in the transmissive area TA.

An edge of the first blocking layer BL1 or an edge of the second blocking layer BL2 disposed in the second pixel area PA2 may define the opening OPN of the transmissive area TA. The features regarding the shape of the blocking layer BL and the opening OPN of the transmissive area TA according to the above-described embodiment may be applied to the illustrated embodiment.

As described, the opening OPN, in which the first blocking layer BL1 and the second blocking layer BL2 disposed in the second pixel area PA2 are removed, is defined in the transmissive area TA, and light may be transmitted through an optical device (not shown) that may be disposed in the rear side of the substrate SB. The optical device may be a sensor, a camera, a flash, or the like.

An encapsulation layer 600 that covers an entirety of the substrate SB is disposed on the entire area of the display area DA, including the light emitting diode LED, the pixel defining layer 350, and the transmissive area TA.

The encapsulation layer 600 may be formed or provided by alternately stacking at least one inorganic layer and at least one organic layer, and may include a plurality of inorganic layers or organic layers, respectively. In the illustrated embodiment, the encapsulation layer 600 includes a first inorganic encapsulation layer 610, an organic encapsulation layer 620, and a second inorganic encapsulation layer 630. The organic encapsulation layer 620 may be disposed between the first inorganic encapsulation layer 610 and the second inorganic encapsulation layer 630.

The first inorganic encapsulation layer 610 and the second inorganic encapsulation layer 630 may include a silicon nitride, a silicon oxide, a titanium oxide, or an aluminum oxide, and the organic encapsulation layer 620 may include an acryl-based organic layer. However, a material included in the encapsulation layer 600 is not limited thereto, and other materials may be included.

The encapsulation layer 600 seals and protects the display device. A first protective layer 710 that may include inorganic insulating materials such as a silicon nitride and a silicon oxide may be disposed on the encapsulation layer 600.

A touch electrode TE may be disposed on the first protective layer 710. In an embodiment, the touch electrode TE may include a metal such as aluminum (Al), copper (Cu), titanium (Ti), molybdenum (Mo), silver (Ag), chromium (Cr), nickel (Ni), or the like. The touch electrode TE may be in the form of a mesh with an opening overlapping a light emitting portion. In an embodiment, the touch electrode TE may include a conductive nanomaterial such as nanowires, carbon nanotubes, or the like. In an embodiment, the touch electrode TE may include a transparent conductive material such as ITO, TZO, or the like.

The touch electrode TE may be electrically connected with a touch driver through a wire disposed in the same layer or a different layer from the touch electrode TE. The touch electrodes TE that are adjacent to each other in the first direction (x-axis) or the second direction (y-axis) may be electrically connected with each other through bridges that are disposed in the same layer or a different layer from the touch electrode TE.

A second protective layer 720 is disposed on the touch electrode TE to protect the touch electrode TE.

A cross-sectional structure of the first pixel area PA1 of the first display area DA1 may correspond to a cross-sectional structure of the second pixel area PA2.

Figure 8:
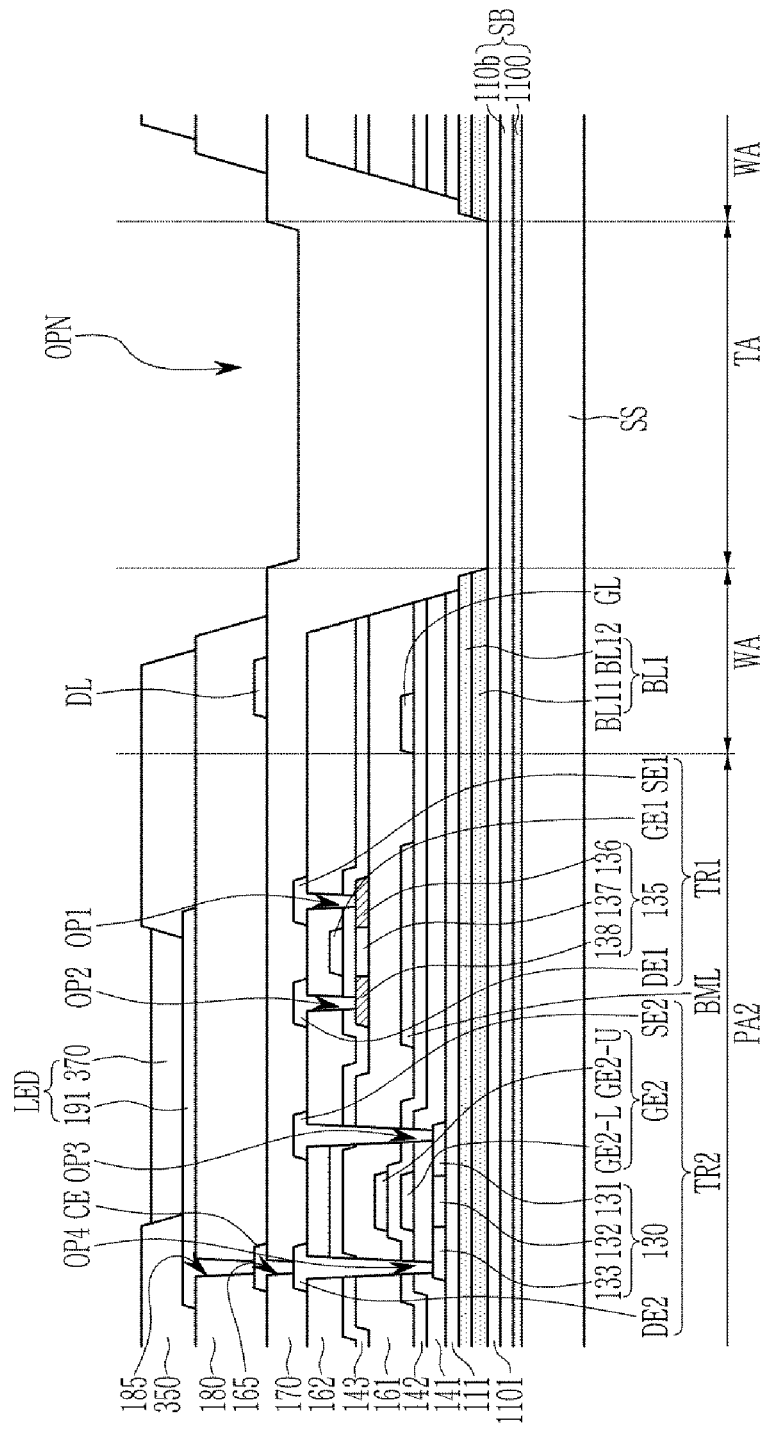
FIG. 8 and FIG. 9 are cross-sectional views provided for description of an embodiment of a manufacturing method of a display device.
Figure 9:
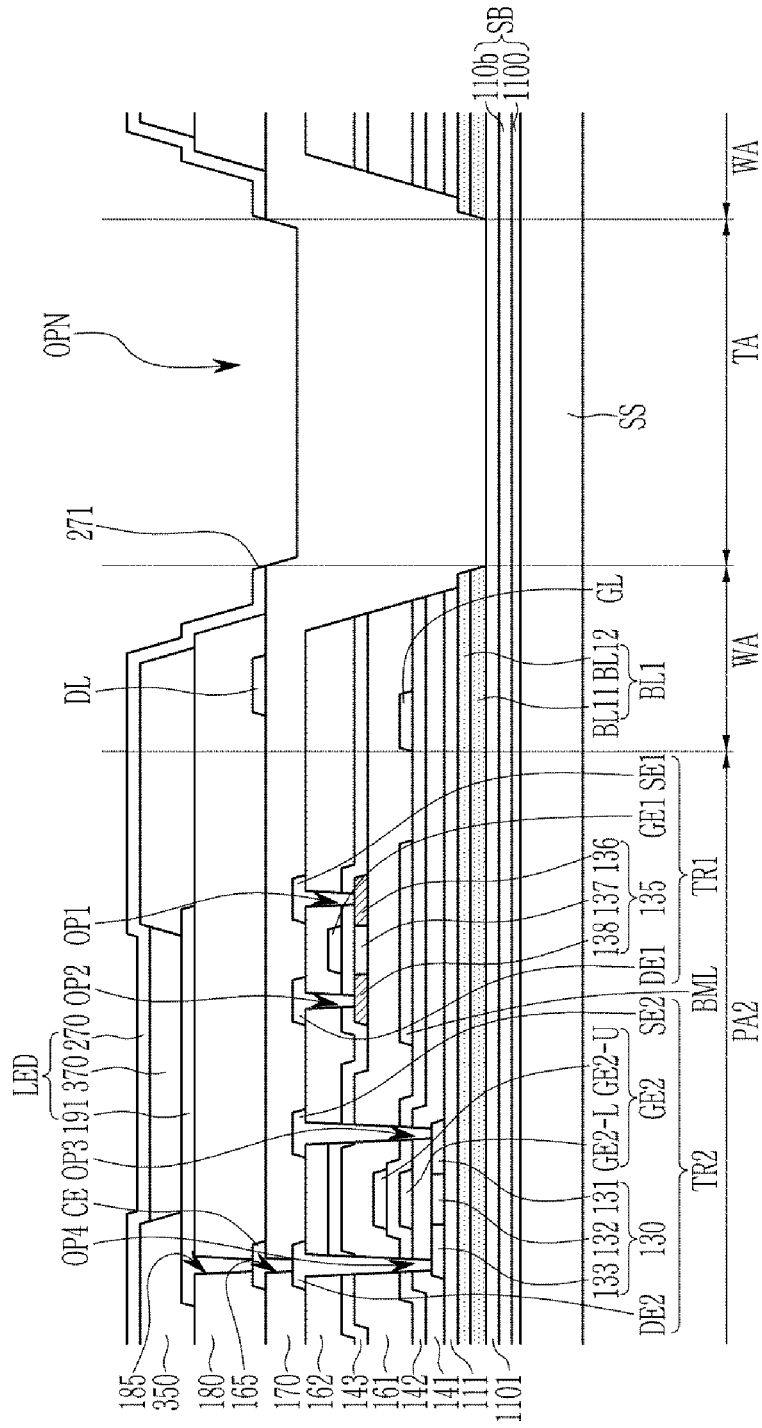
Figure 10:
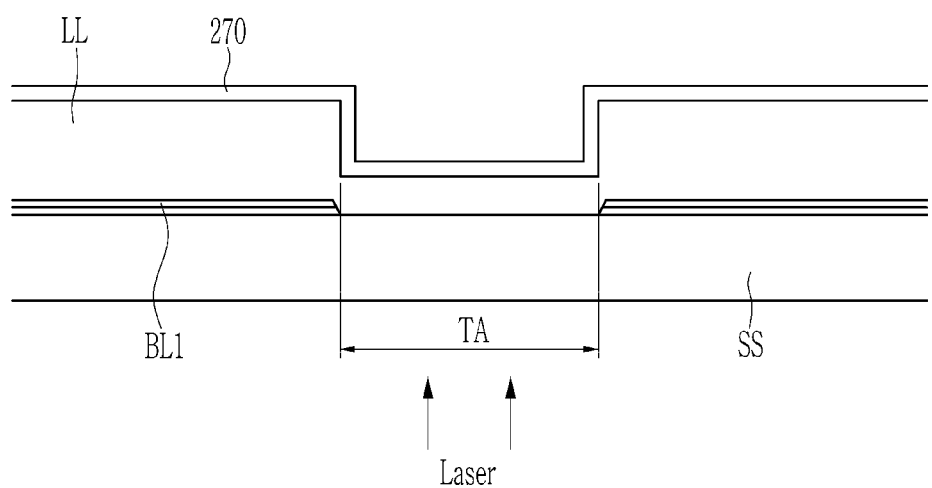
FIG. 10 is a schematic view for description of the embodiment of a part of a manufacturing process of the display device.
Figure 11A:
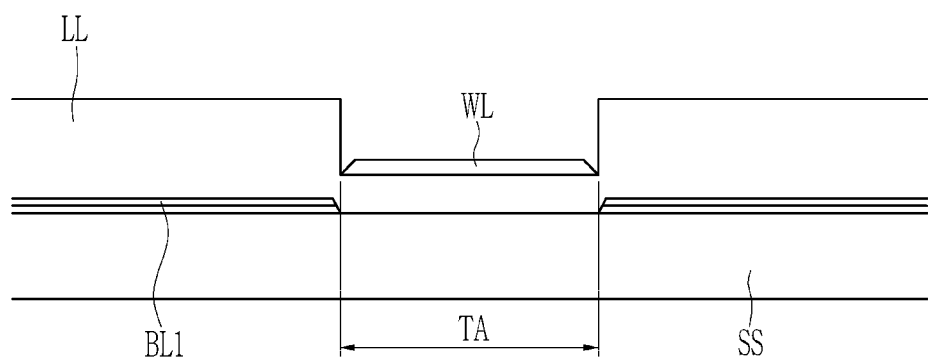
FIG. 11A to FIG. 11C are schematic views provided for description of the embodiment of the manufacturing process of the display device.
Figure 11B:
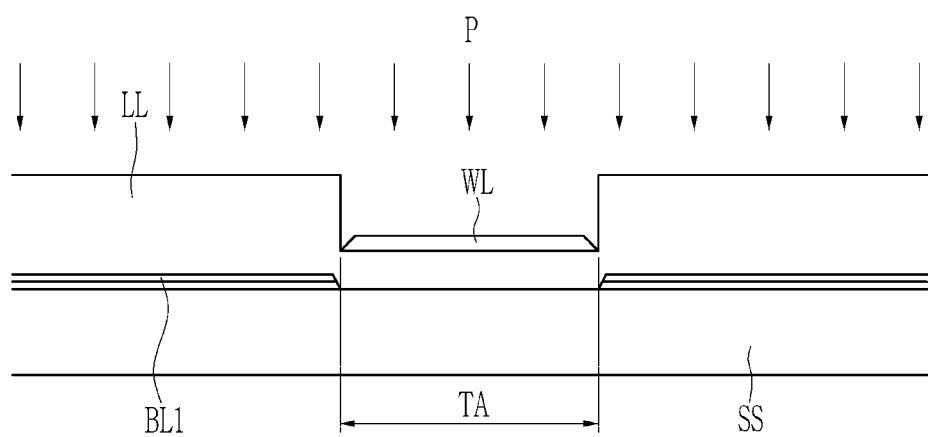
Figure 11C:
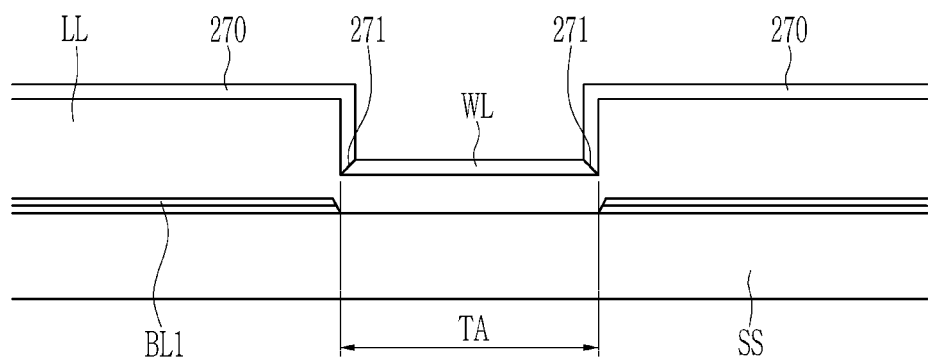
Figure 12:
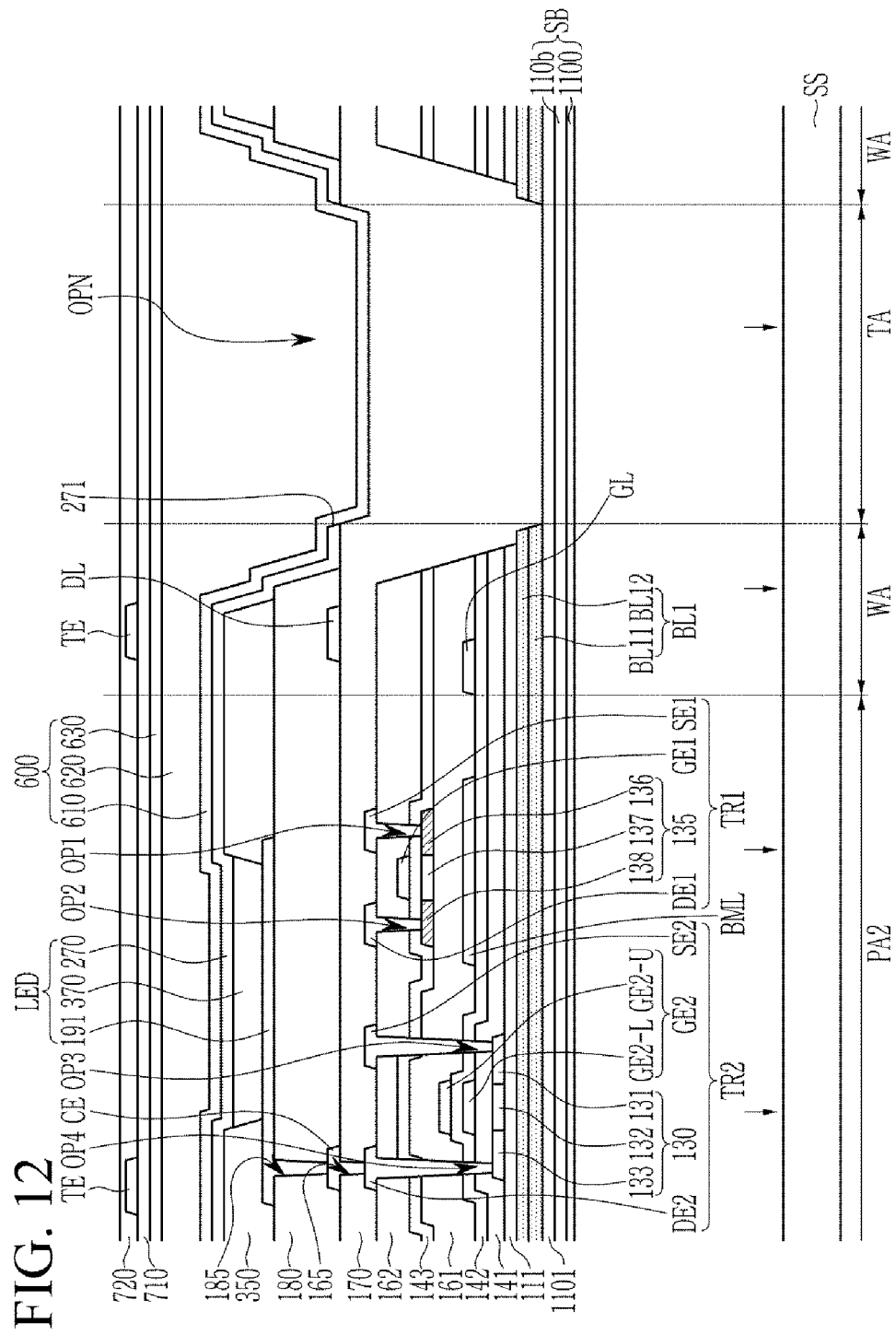
FIG. 12 and FIG. 13 are cross-sectional views of the embodiment of the manufacturing method of the display device.
Figure 13:
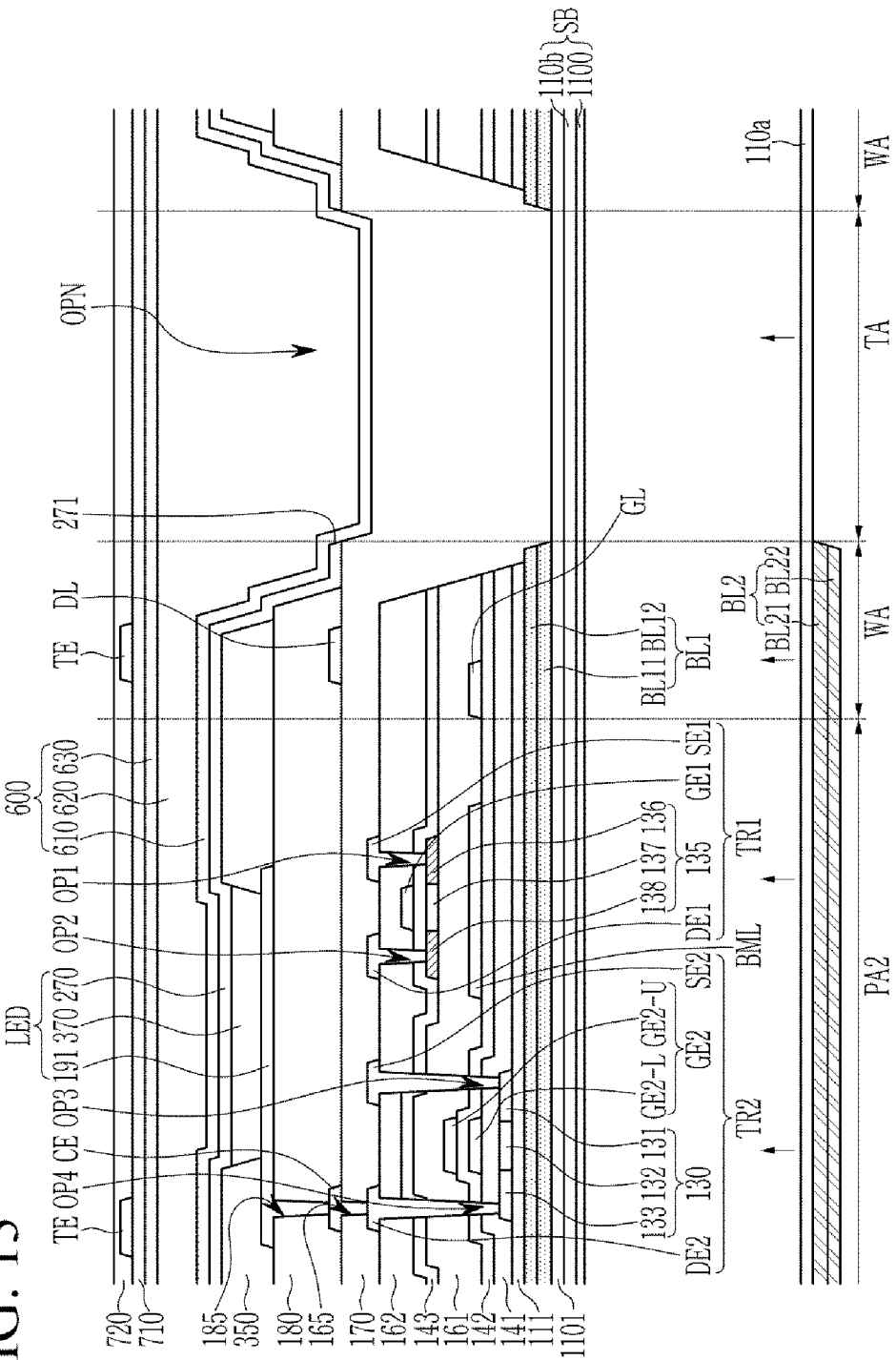

Next, referring to FIG. 8 to FIG. 13, a manufacturing method of a display device in an embodiment will be described. FIG. 8 and FIG. 9 are cross-sectional views provided for description of an embodiment of a manufacturing method of a display device. FIG. 10 is a schematic view for description of the embodiment of a part of a manufacturing process of the display device, and FIG. 11A to FIG. 11C are schematic views provided for description of the embodiment of the manufacturing process of the display device. FIG. 12 and FIG. 13 are cross-sectional views of the embodiment of the manufacturing method of the display device.

As shown in FIG. 8, a first barrier layer 1100 and a second layer 110b among a substrate SB are attached to a support substrate SS, a first blocking layer BL1 that includes a second barrier layer 1101 and a second barrier layer 1102 is formed or disposed on the second layer 110b, a first blocking layer BL1 that includes a first layer BL11 and a second layer BL12 disposed on the first layer BL11 is formed or disposed on the second barrier layer 1101, a buffer layer 111 is formed or disposed on the first blocking layer BL1, a first transistor TR1 and a second transistor TR2 are formed or disposed on the buffer layer 111, and then an anode 191, a pixel defining layer 350, and a light emitting element layer 370 are formed or provided. In this case, in the transmissive area TA, a first inter-insulating layer 161, a third gate insulating layer 143, and a second inter-insulating layer 162 that are disposed in a second pixel area PA2, a second planarization layer 180, and a pixel defining layer 350 may be removed.

As shown in FIG. 9, a cathode 270 is formed or disposed on the light emitting element layer 370 and the pixel defining layer 350. An edge 271, which is an end portion of the cathode 270, may be formed or provided to be aligned with an edge of the first blocking layer BL1 in a vertical direction, that is, a third direction (z-axis).

Next, referring to FIG. 10, a method for forming the cathode 270 on the light emitting element layer 370 and the pixel defining layer 350 will be described.

Referring to FIG. 10, the first blocking layer BL1 is formed or disposed on the substrate SB, an element layer LL such as a plurality of insulation layers, a thin film transistor, an anode, an organic light emitting layer, or the like is formed or disposed on the first blocking layer BL1, and then the cathode 270 is formed or disposed on an entirety of the substrate SB. After that, an intense light (e.g., laser) is irradiated by the blocking layer BL as a mask in the rear side of the substrate SB to remove a part of the cathode 270 such that the cathode 270 is removed in the transmissive area TA, thereby preventing deterioration of transmittance of the transmissive area TA.

Referring to FIG. 11A to FIG. 11C, another method for forming the cathode 270 on the light emitting element layer 370 and the pixel defining layer 350 will be described.

As shown in FIG. 11A, a partitioning wall WL that is disposed in the transmissive area TA is formed or provided by a fine metal mask ("FMM"). The partitioning wall WL may be a weak adhesion layer.

Referring to FIG. 11B, a metal particle P that forms the cathode 270 is stacked on the substrate SB where the partitioning wall WL is formed or provided. The metal particle P is stacked up to an area where the partitioning wall WL is not disposed and a side of the partitioning wall WL, and thus, as shown in 11C, the cathode 270 is formed or provided so that the edge of the partitioning wall WL and the edge 271 of the cathode 270 coincide with each other.

Next, as shown in FIG. 12, an encapsulation layer 600 covering the entire surface of the substrate SB is formed or provided over the entire region including the light emitting diode LED and the pixel defining layer 350 of the display area DA and the transmissive area TA, a first protective layer 710 is formed or provided over the encapsulation layer 600, a touch electrode TE is formed or disposed on the protective layer 710, a second protective layer 720 is formed or disposed on the touch electrode TE, and a support substrate SS is removed.

As shown in FIG. 13, after the support substrate SS is removed, a first layer 110a that includes the second blocking layer BL2 is attached below the first barrier layer 1100 and the second layer 110b of the substrate SB such that the display device shown in FIG. 7 is formed or provided. In this case, the edges of the second blocking layer BL2 disposed below the first layer 110a and the first blocking layer BL1 disposed above the substrate SB may be attached to be aligned with each other in the vertical direction, that is, the third direction (z-axis). However, the edges of the second blocking layer BL2 disposed below the first layer 110a and the first blocking layer BL1 disposed above the substrate SB may not be aligned with each other in the vertical direction, that is, the third direction (z-axis).

Next, a display device in another embodiment will be described with reference to FIG. 14. FIG. 14 is a cross-sectional view of another embodiment of a second display area of a display device.

Referring to FIG. 14, a display device in the illustrated embodiment includes a substrate SB and a plurality of layers, wires, and elements formed or disposed on the substrate SB. The elements may include a transistor TR, a capacitor CP, and a light emitting diode LED.

The substrate SB may include an insulating material such as glass or the like, and may be optically transparent.

A barrier layer 1101 is disposed on the substrate SB. The barrier layer 1101 serves to simultaneously planarize the surface while preventing penetration of unnecessary components such as impurity or moisture. In an embodiment, the barrier layer 1101 may include at least one of a silicon oxide, a silicon nitride, a silicon oxide, and amorphous silicon, for example.

A first blocking layer BL1 is disposed on the barrier layer 1101, and a second blocking layer BL2 is disposed below the substrate SB.

The first blocking layer BL1 and the second blocking layer BL2 may prevent visual recognition due to inflow of light from a lower portion of the substrate SB. In particular, the first blocking layer BL1 and the second blocking layer BL2 are disposed in the second pixel area PA2 and a wiring area WA, excluding the transmissive area TA, and thus it is possible to prevent performance degradation due to unnecessary external light of electronic devices disposed under the transmissive area TA. The first blocking layer BL1 and the second blocking layer BL2 may be aligned with each other in the vertical direction, that is, the third direction (z-axis).

The first blocking layer BL1 includes a first layer BL11 disposed on the second barrier layer 1101 and a second layer BL12 disposed on the first layer BL11, and the second blocking layer BL2 includes a third layer BL21 disposed below the substrate SB and a fourth layer BL22 disposed below the third layer BL21.

The first layer BL11 of the first blocking layer BL1 may include amorphous silicon. The second layer BL12 of the first blocking layer BL1 may include a metal. In an embodiment, the second blocking layer BL2 of the blocking layer BL may include molybdenum (Mo), aluminum (Al), titanium (Ti), copper (Cu), or the like, for example.

In an embodiment, a thickness of the first layer BL11 of the first blocking layer BL1 may be greater than about 20 Å and less than about 300 Å.

An absorption coefficient (k) of the second layer BL12 of the first blocking layer BL1 may be greater than an absorption coefficient (k) of the first layer BL11 of the first blocking layer BL1. In an embodiment, the absorption coefficients of the first layer BL11 and the second layer BL12 may be measured in a visible ray region, for example, with light in a wavelength range of about 380 nm to about 780 nm as a reference.

As described, since the first blocking layer BL1 includes the first layer BL11 having a small absorption coefficient (k) value and the second layer BL12 having a large absorption coefficient (k), light that has passed through the first layer BL11 of the first blocking layer BL1 may be absorbed by the second layer BL12 with a large absorption coefficient, and a part of the light reflected from the surface of the second layer BL12 interferes with the light reflected from the first layer BL11 such that light inflowing from the lower part of the display device is reflected from the first blocking layer BL1 to prevent inflow toward the optical device disposed under the substrate SB.

In an embodiment, the third layer BL21 of the second blocking layer BL2 may be a molybdenum tantalum oxide (MoTaOx), and a tantalum content included in the third layer BL21 of the second blocking layer BL2 may be about 8 wt % or more. When the third layer BL21 of the second blocking layer BL2 is a molybdenum tantalum oxide (MoTaOx) and a tantalum content included in the third layer BL21 of the second blocking layer BL2 is about 8 wt % or more, an optical characteristic of the first blocking layer BL1 may be maintained even after a high temperature process of about 450° C.

In an embodiment, a thickness of the third layer BL21 of the second blocking layer BL2 may be about 400 nm to about 700 nm. In an embodiment, a refractive index of the third layer BL21 of the second blocking layer BL2 may be about 2 to about 3, specifically, about 2.2 to about 2.6, more specifically about 2.46, and an extinction coefficient of the third layer BL21 of the second blocking layer BL2 may be about 0.5 to about 0.9, more specifically about 0.67.

In an embodiment, the fourth layer BL22 of the second blocking layer BL2 may include a silicon oxide, and a thickness of the fourth layer BL22 of the second blocking layer BL2 may be included within a range of about 20 Å to about 300 Å.

As described, since the extinction coefficient of the third layer BL21 of the second blocking layer BL2 is about 0.5 to about 0.9, more specifically, about 0.67, light inflow from the lower portion of the display device may be absorbed in the third layer BL21 of the second blocking layer BL2 and light that is not absorbed and reflected from the third layer BL21 of the second blocking layer BL2 is reflected from the fourth layer BL22 of the second blocking layer BL2 by being interfered with each other with light, and thus light inflow from the lower portion of the display device is reflected from the second blocking layer BL2 and inflow to the optical device disposed below the substrate SB may be prevented.

In the display device in the embodiment, the first blocking layer BL1 disposed above the substrate SB and the second blocking layer BL2 disposed below the substrate SB are included and thus light incident from a lower portion of the display device may be prevented from passing through the substrate SB and being incident on a light emitting portion or being viewed at the periphery of the transmissive area TA, and simultaneously preventing the light incident from the lower portion of the display device from being reflected by the first blocking layer BL1 and the second blocking layer BL2 and thus being incident toward the optical device disposed below the substrate, thereby preventing quality deterioration of the optical device due to inflow of unnecessary external light.

A buffer layer 111 may be disposed on the second barrier layer 1101 and the first blocking layer BL1. The buffer layer 111 may have a single-layer or multi-layer structure. In an embodiment, the buffer layer 111 may include a silicon nitride ($SiN_x$), a silicon oxide ($SiO_x$), a silicon oxynitride (SiOxNy), or the like.

A semiconductor layer AL of a transistor TR may be disposed on the buffer layer 111. The semiconductor layer AL may include a channel region, and a source region and a drain region disposed at opposite sides of the channel region. The semiconductor layer AL may include polysilicon. In addition, the semiconductor layer AL may include amorphous silicon, or a semiconductor material such as an oxide semiconductor.

A gate insulating layer 141 that may include an inorganic insulating material may be disposed on the semiconductor layer AL. In an embodiment, the gate insulating layer 141 may be a single-layer or multi-layer structure including a silicon nitride, a silicon oxide, a silicon oxynitride, or the like, for example.

A first conductor that may include a first gate electrode GE1 of the transistor TR, and a gate line GL may be disposed on the gate insulating layer 141. The first gate electrode GE1 may overlap the channel region of the semiconductor layer AL. In an embodiment, the first conductor may have a single-layer or multi-layer structure including a metal such as molybdenum (Mo), copper (Cu), aluminum (Al), silver (Ag), chromium (Cr), tantalum (Ta), titanium (Ti), or the like.

A first inter-insulating layer 161 may be disposed on the first conductor. The first inter-insulating layer 161 may include a silicon nitride, a silicon oxide, a silicon oxynitride, or the like.

A second conductor that includes a second gate electrode GE2 overlapping the first gate electrode GE1 may be disposed on the first inter-insulating layer 161. In an embodiment, the second conductor may include a metal such as molybdenum (Mo), copper (Cu), aluminum (Al), silver (Ag), chromium (Cr), tantalum (Ta), titanium (Ti), or the like.

A second inter-insulating layer 162 is disposed on the second conductor. The second inter-insulating layer 162 may include a silicon nitride, a silicon oxide, a silicon oxynitride, or the like. The second inter-insulating layer 162 may include a multi-layer where a layer including a silicon nitride and a layer including a silicon oxide are stacked.

A third conductor that may include a source electrode SE and a drain electrode DE of the transistor TR, a data line DL, and a driving voltage line may be disposed on the second inter-insulating layer 162. The source electrode SE and the drain electrode DE may be respectively connected to the source region and the drain region of the semiconductor layer AL through contact holes that are respectively defined in the first inter-insulating layer 161 and the second inter-insulating layer 162. In an embodiment, the third conductor may include aluminum (Al), platinum (Pt), palladium (Pd), silver (Ag), magnesium (Mg), gold (Au), neodymium (Nd), iridium (Ir), chromium (Cr), nickel (Ni), calcium (Ca), molybdenum (Mo), tungsten (W), titanium (Ti), chromium (Cr), tantalum (Ta), and/or copper (Cu), and may have a single-layer or multi-layer structure including the same. In an embodiment, the third conductor may have a triple-layer structure of a lower layer including refractory metals such as molybdenum, chromium, tantalum, and titanium, or an alloy thereof, an interlayer including an aluminum-based metal with low resistivity, a silver-based metal, and a copper-based metal, and an upper layer including refractory metals such as molybdenum, chromium, tantalum, and titanium, for example.

The gate electrode GE, the source electrode SE, and the drain electrode DE form the transistor TR with the semiconductor layer AL. The first gate electrode GE1 and the second gate electrode GE2 may form a capacitor CP with the first inter-insulating layer 161 between them. The transistor TR and the capacitor CP forming a pixel circuit may be disposed in the second pixel area PA2, but not in the transmissive area TA.

A planarization layer 180 that may include an organic insulating material may be disposed on the second inter-insulating layer 162 and the third conductor. The second planarization layer 180 may serve to planarize and remove steps in order to increase luminous efficiency of a light emitting element to be formed or provided thereon. In an embodiment, planarization layer 180 may include an organic insulating material such as a general-purpose polymer such as PMMA or PS, a polymer derivative having a phenolic group, an acryl-based polymer, an imide-based polymer, a polyimide, an acryl-based polymer, and a siloxane-based polymer, for example.

An anode 191 of the light emitting diode LED of the pixel PX may be disposed on the second planarization layer 180. The anode 191 may be provided individually for each pixel PX. In an embodiment, the anode 191 may include a metal such as silver (Ag), lithium (Li), calcium (Ca), aluminum (Al), magnesium (Mg), gold (Au), or the like, and may include a TCO such as an ITO, an IZO, or the like.

A pixel defining layer 350 may be disposed on the anode 191. In an embodiment, the pixel defining layer 350 may include an organic insulating material such as a general-purpose polymer such as PMMA or PS, a polymer derivative having a phenolic group, an acryl-based polymer, an imide-based polymer, a polyimide, an acryl-based polymer, or a siloxane-based polymer.

An opening may be defined in the pixel defining layer 350, and the opening of the pixel defining layer 350 may overlap the anode 191. The light emitting element layer 370 may be disposed in the pixel defining layer 350.

The light emitting element layer 370 may include a material layer that uniquely emits light of basic colors such as red, green, and blue. The light emitting element layer 370 may have a structure in which a plurality of material layers emitting light of different colors is stacked.

A cathode 270 may be disposed on the light emitting element layer 370 and the pixel defining layer 350. The cathode 270 may be provided in common to all pixels PX and may be applied with a common voltage. In an embodiment, the cathode 270 may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), calcium (Ca), or the like, or may include a TCO such as an ITO, an IZO, or the like.

The cathode 270 is removed in the transmissive area TA, and thus an edge 271, which is an end portion of the cathode 270, may be aligned with an edge of the first blocking layer BL1 or an edge of the second blocking layer BL2 in a vertical direction, that is, a third direction (z-axis). As described, since the cathode 270 is removed in the transmissive area TA, transmittance of the transmissive area TA may be improved.

The anode 191, the light emitting element layer 370, and the cathode 270 form the light emitting diode LED.

The first blocking layer BL1 and the second blocking layer BL2 that are disposed in the second pixel area PA2 are also disposed in the wiring area WA. The gate line GL and the data line DL may be disposed in the wiring area WA.

In the transmissive area TA, the gate insulating layer 141 and the first inter-insulating layer 161 that are disposed in the second pixel area PA2 may be removed. In addition, in the transmissive area TA, the second planarization layer 180 and the pixel defining layer 350 may be removed. However, the invention is not limited thereto, and at least one of the gate insulating layer 141, the first inter-insulating layer 161, the second inter-insulating layer 162, the second planarization layer 180, and the pixel defining layer 350 disposed in the second pixel area PA2 may be removed or may not be removed in the transmissive area TA.

The first blocking layer BL1 or an edge portion of the second blocking layer BL2 disposed in the second pixel area PA2 may define an opening OPN of the transmissive area TA.

The features regarding the shape of the first blocking layer BL1, the second blocking layer BL2, and the opening OPN of the transmissive area TA according to the above-described embodiment may be applied to the illustrated embodiment.

As described, the opening OPN, in which the first blocking layer BL1 and the second blocking layer BL2 disposed in the second pixel area PA2 are removed, is defined the transmissive area TA, and light may be transmitted through an optical device (not shown) that may be disposed in the rear side of the substrate SB. The optical device may be a sensor, a camera, a flash, or the like.

In addition, in the transmissive area TA where the first blocking layer BL1 and the second blocking layer BL2 are removed, the second planarization layer 180 and the pixel defining layer 350, which may be organic insulating layers, and the gate insulating layer 141, the first inter-insulating layer 161, and the second inter-insulating layer 162, which may be inorganic insulating layers, are removed together, thereby increasing light transmittance of the transmissive area TA.

Although it is not illustrated, a thin film encapsulation layer or an encapsulation substrate that covers an entirety of the substrate SB may be disposed on the entire area including the light emitting diode LED, the pixel defining layer 350, and the transmissive area TA of the display area DA. When the encapsulation substrate is disposed, glass frit may be used.

In addition, although it is not illustrated, a touch substrate including a touch layer or a touch wire may be disposed on the thin film encapsulation layer or the encapsulation substrate.

A cross-sectional structure of the first pixel area PA1 of the first display area DA1 may correspond to a cross-sectional structure of the second pixel area PA2.

Many features of the display device according to the above-described embodiment are applicable to all of the display devices in the illustrated embodiment.

Figure 15:
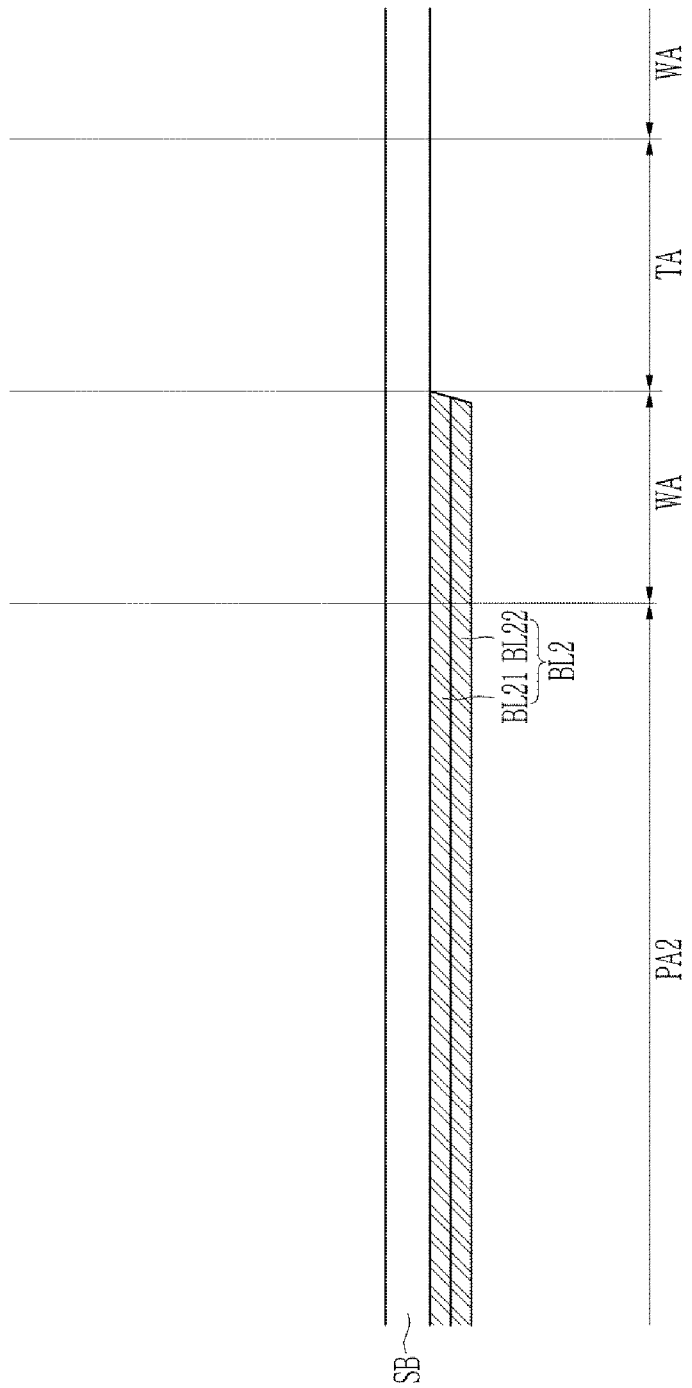
FIG. 15 to FIG. 17 are cross-sectional views provided for description of another embodiment of a manufacturing method of a display device.
Figure 16:
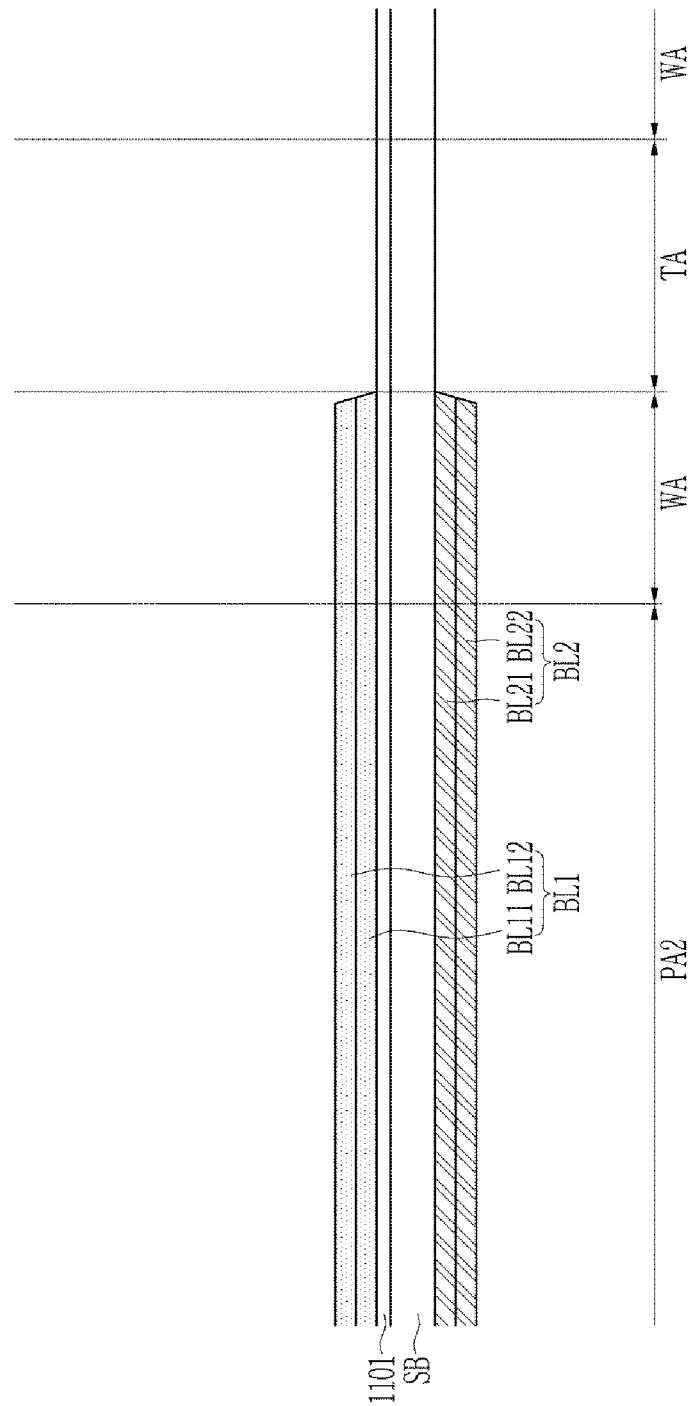
Figure 17:
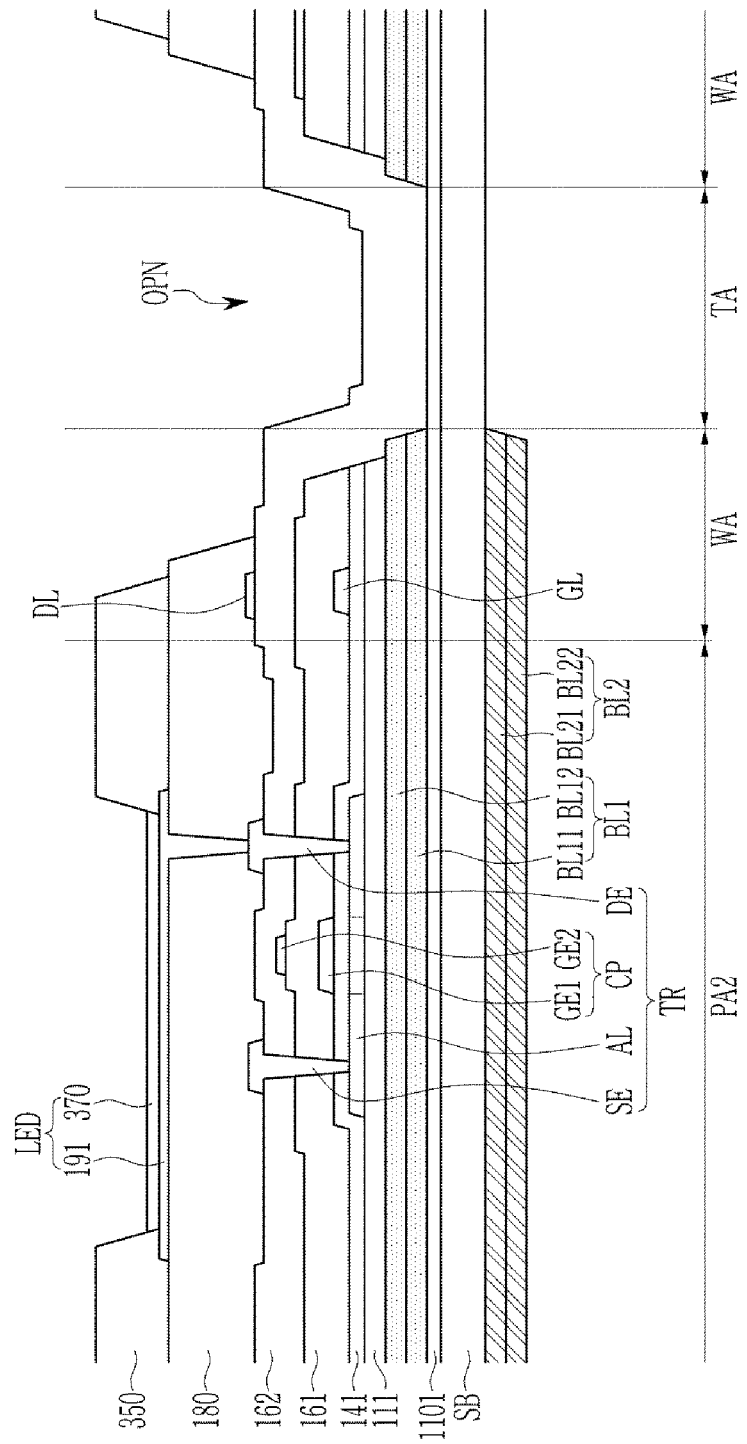
Figure 18:
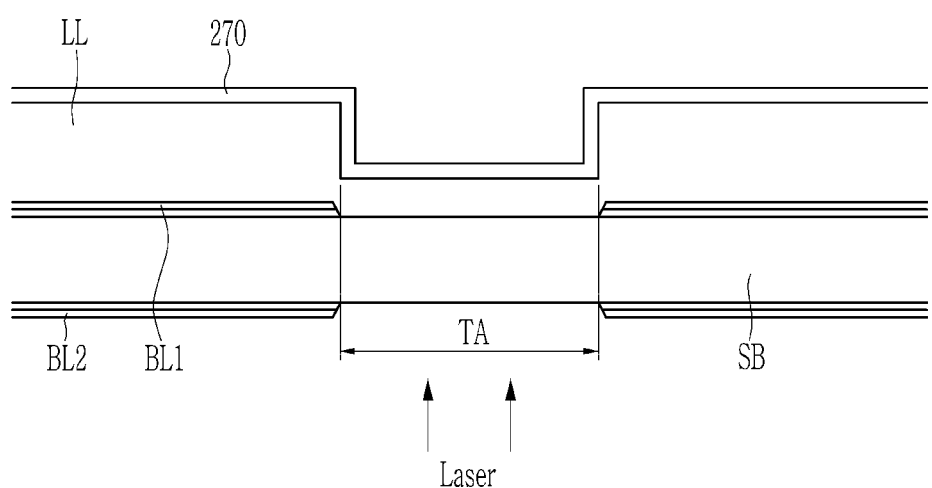
FIG. 18 is a schematic view for description of the embodiment of a part of a manufacturing process of the display device.
Figure 19A:
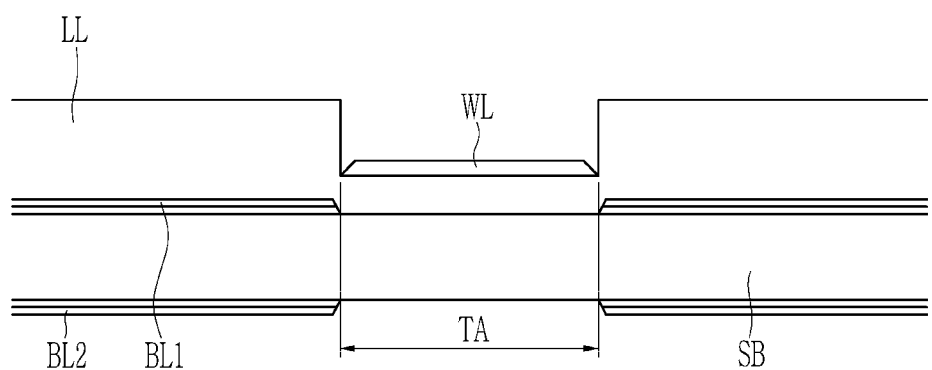
FIG. 19A to FIG. 19C are schematic views provided for description of the embodiment of the manufacturing process of the display device.
Figure 19B:
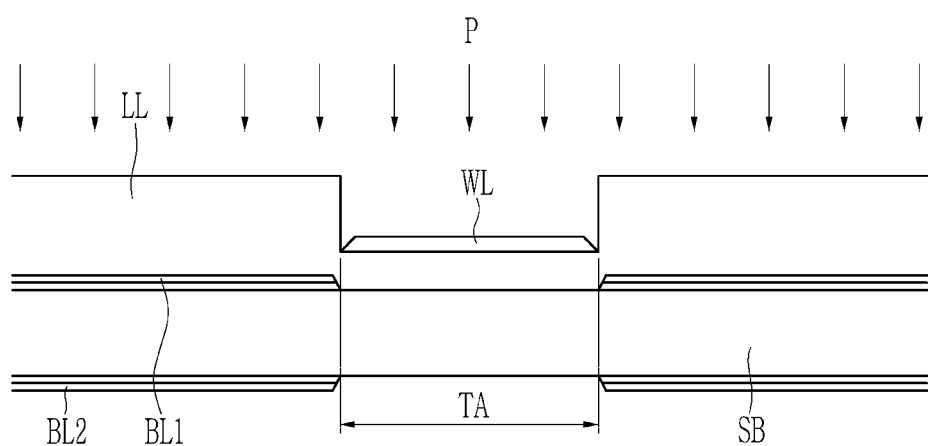
Figure 19C:
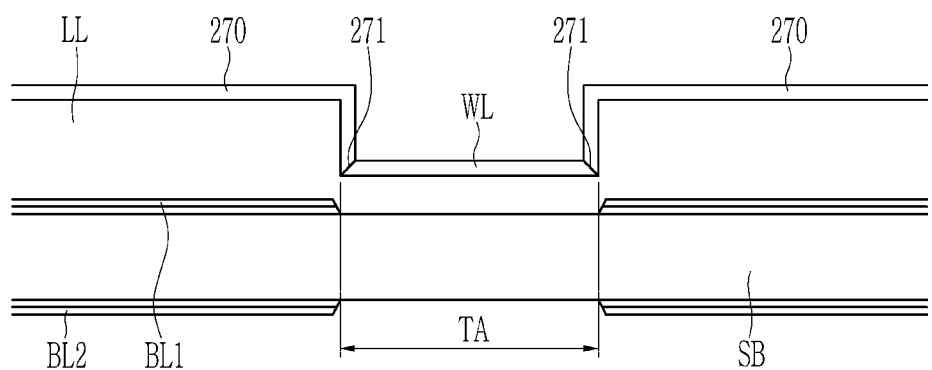

Next, referring to FIG. 15 to FIG. 19C, a manufacturing method of a display device in another embodiment will be described. FIG. 15 to FIG. 17 are cross-sectional views provided for description of another embodiment of a manufacturing method of a display device. FIG. 18 is a schematic view for description of the embodiment of a part of a manufacturing process of the display device, and FIG. 19A to FIG. 19C are schematic views provided for description of the embodiment of the manufacturing process of the display device.

As shown in FIG. 15, a second blocking layer BL2 that includes a third layer BL21 and a fourth layer BL22 disposed below the third layer BL21 is formed or disposed below a substrate SB. In an embodiment, the third layer BL21 of the second blocking layer BL2 may be a molybdenum tantalum oxide (MoTaOx), a tantalum content included in the third layer BL21 of the second blocking layer BL2 may be about 8 wt % or more, and the fourth layer BL22 of the second blocking layer BL2 may include a silicon oxide.

As shown in FIG. 16, a barrier layer 1101 is formed or disposed on the substrate SB, and a first blocking layer BL1 that includes a first layer BL11 and a second layer BL12 disposed on the first layer BL11 is formed or disposed on the barrier layer 1101. The first layer BL11 of the first blocking layer BL1 may include amorphous silicon, and the second layer BL12 of the first blocking layer BL1 may include a metal.

In an embodiment, a thickness of the first layer BL11 of the first blocking layer BL1 may be greater than about 20 Å and less than about 300 Å.

An absorption coefficient (k) of the second layer BL12 of the first blocking layer BL1 may be greater than an absorption coefficient (k) of the first layer BL11 of the first blocking layer BL1. In an embodiment, the absorption coefficients of the first layer BL11 and the second layer BL12 may be measured with reference to a visible light region, for example, light in a wavelength range of about 380 nm to about 780 nm.

As shown in FIG. 17, a buffer layer 111 is formed or disposed on the second barrier layer 1101 and the first blocking layer BL1, a transistor TR is formed or disposed on the buffer layer 111, an anode 191 of a light emitting diode LED is formed or disposed on a planarization layer 180, a pixel defining layer 350 is formed or disposed on the anode 191, and a light emitting element layer 370 is formed or disposed in an opening of the pixel defining layer 350.

Next, a cathode 270 (refer to FIG. 18) is formed or disposed on the light emitting element layer 370 and the pixel defining layer 350.

Next, referring to FIG. 18, a method for forming the cathode 270 on the light emitting element layer 370 and the pixel defining layer 350 will be described.

Referring to FIG. 18, the second blocking layer BL2 is formed or disposed below the substrate SB and the first blocking layer BL1 is formed or disposed on the substrate SB, and then an element layer LL such as a plurality of insulation layers, a thin film transistor, an anode, an organic light emitting layer, or the like is formed or disposed on the first blocking layer BL1 and the cathode 270 is formed or disposed on an entirety of the substrate SB. A laser is irradiated by the first blocking layer BL1 and the second blocking layer BL2 as masks in the rear side of the substrate SB to remove a part of the cathode 270 such that the cathode 270 is removed in the transmissive area TA, thereby preventing deterioration of transmittance of the transmissive area TA.

Referring to FIG. 19A to FIG. 19C, another method for forming the cathode 270 on the light emitting element layer 370 and the pixel defining layer 350 will be described.

As shown in FIG. 19A, the second blocking layer BL2 is formed or disposed below the substrate SB and the first blocking layer BL1 is formed or disposed on the substrate SB, and then an element layer LL such as a plurality of insulation layers, a thin film transistor, an anode, an organic light emitting layer, or the like is formed or disposed on the first blocking layer BL1 and a partitioning wall WL is formed or provided in the transmissive area TA by a FMM. The partitioning wall WL may be a weak adhesion layer.

Referring to FIG. 19B, metal particles P that form the cathode 270 is stacked on the substrate SB where the partitioning wall WL is formed or provided. The metal particles P are stacked up to an area where the partitioning wall WL is not disposed and a side of the partitioning wall WL, and thus, as shown in FIG. 19C, the cathode 270 is formed or provided so that the edge of the partitioning wall WL and the edge 271 of the cathode 270 coincide with each other.

Next, referring to Table 1, an experimental example will be described. In the experimental example, other conditions were the same, while changing a thickness of the first layer BL11 of the first blocking layer BL1 and a thickness of the fourth layer BL22 of the second blocking layer BL2, and reflectance values of light on the substrate SB surface were measured. Simulation values and actual measurement values of a product are shown in Table 1 below.

TABLE 1

| No | Thickness of layer | | Reflectance value | |
|---|---|---|---|---|
| | BL11 | BL22 | simulation | measurement |
| 1 | 50 | 50 | 20.6 | 15.67 |
| 2 | 50 | 100 | 17.3 | 14.83 |
| 3 | 50 | 150 | 15.1 | 14.15 |
| 4 | 100 | 50 | 11.6 | 10.93 |
| 5 | 100 | 100 | 9.9 | 10.38 |
| 6 | 100 | 150 | 10.4 | 10.32 |
| 7 | 125 | 50 | 10.7 | 10 |
| 8 | 125 | 100 | 11 | 9.91 |
| 9 | 150 | 50 | 12.1 | 9.91 |
| 10 | 150 | 100 | 14.6 | 10.57 |
| 11 | 150 | 150 | 19 | 12.64 |

Referring to Table 1, like the display device in the embodiments, when the thickness of the first layer BL11 of the first blocking layer BL1 is greater than about 20 Å and less than about 300 Å and a thickness of the fourth layer BL22 of the second blocking layer BL2 is in the range of about 20 Å to about 300 Å, it was determined that the reflectivity of the incident light may have a value of less than 12, and accordingly, it was determined that light inflow from the lower part of the display device is reflected from the first blocking layer BL1 and the second blocking layer BL2 and inflow toward the optical device disposed below the substrate SB may be prevented.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:
a substrate which includes a display area and a transmissive area;
a first blocking layer which is disposed in the display area of the substrate, and disposed on a first surface of the substrate;
a second blocking layer which is disposed in the display area of the substrate, and disposed on a second surface of the substrate opposite to the first surface;
an insulation layer which is disposed on the first blocking layer;
a transistor which is disposed on the insulation layer; and
a light emitting element which is connected to the transistor.

2. The display device of claim 1, wherein:
the first blocking layer includes a first layer disposed on the substrate and a second layer disposed on the first layer, and
the second blocking layer includes a third layer disposed below the substrate and a fourth layer disposed below the third layer.

3. The display device of claim 2, wherein:
the first blocking layer includes a metal, and the second blocking layer includes a metal oxide.

4. The display device of claim 2, wherein:
the first layer of the first blocking layer includes amorphous silicon, and
the second layer of the first blocking layer includes a metal.

5. The display device of claim 4, wherein:
the third layer of the second blocking layer includes a metal oxide, and
the fourth layer of the second blocking layer includes a silicon oxide.

6. The display device of claim 5, wherein:
the metal oxide of the third layer of the second blocking layer is a molybdenum tantalum oxide, and an amount of tantalum in the metal oxide is about 8 wt % or more.

7. The display device of claim 6, wherein:
a refractive index of the third layer of the second blocking layer is about 2.2 to about 2.6.

8. The display device of claim 7, wherein:
the refractive index of the third layer of the second blocking layer is about 2.46.

9. The display device of claim 6, wherein:
an extinction coefficient of the third layer of the second blocking layer is about 0.5 to about 0.9.

10. The display device of claim 6, wherein:
an extinction coefficient of the third layer of the second blocking layer is about 0.67.

11. The display device of claim 6, wherein:
the metal includes at least one of molybdenum, aluminum, titanium, and copper.

12. The display device of claim 5, wherein:
a thickness of the first layer of the first blocking layer in a direction perpendicular to a main extension of the substrate is greater than about 20 angstroms and less than about 300 angstroms.

13. The display device of claim 12, wherein:
a thickness of the fourth layer of the second blocking layer in the direction perpendicular to the main extension of the substrate is included in a range of about 20 angstroms to about 300 angstroms.

14. A display device comprising:
a substrate including:
a first display area including a first pixel area; and
a second display area which includes a second pixel area and a transmissive area neighboring each other;
an optical device which overlaps the second display area; and a first blocking layer and a second blocking layer which are disposed in the second pixel area of the second blocking layer, the first blocking layer disposed on a first surface of the substrate, and the second blocking layer disposed on a second surface of the substrate opposite to the first surface.

15. The display device of claim 14, wherein:
openings overlapping the transmissive area are defined in the first blocking layer and the second blocking layer, and
an opening of the openings is defined in a shape of a planar cross.

16. The display device of claim 15, wherein:
an edge of the opening is defined in the shape of the planar cross having a planar shape in which a recess portion and a convex portion are repeated.

17. The display device of claim 14, wherein:
openings overlapping the transmissive area are defined in the first blocking layer and the second blocking layer, and
an opening of the openings has a circular or oval planar shape.

18. The display device of claim 14, wherein:
the first blocking layer includes a first layer disposed on the substrate and a second layer disposed on the first layer, and
the second blocking layer includes a third layer disposed below the substrate and a fourth layer disposed below the third layer.

19. The display device of claim 18, wherein:
the first layer of the first blocking layer includes amorphous silicon,
the second layer of the first blocking layer includes a metal,
the third layer of the second blocking layer includes a metal oxide, and
the fourth layer of the second blocking layer includes a silicon oxide.

20. The display device of claim 19, wherein:
the metal oxide of the third layer of the second blocking layer is a molybdenum tantalum oxide, and an amount of tantalum in the metal oxide is about 8 wt % or more.

* * * * *